United States Patent
Blackburn et al.

(10) Patent No.: US 11,477,904 B2
(45) Date of Patent: Oct. 18, 2022

(54) ELECTRONIC ASSEMBLY INCLUDING CABLE MODULES

(71) Applicant: TE CONNECTIVITY CORPORATION, Berwyn, PA (US)

(72) Inventors: Christopher William Blackburn, Bothell, WA (US); Jeffery Walter Mason, North Attleboro, MA (US); Nathan Lincoln Tracy, Harrisburg, PA (US); Clarence Leon Yu, Sacramento, CA (US); Michael David Herring, Apex, NC (US)

(73) Assignee: TE CONNECTIVITY SOLUTIONS GmbH, Schaffhausen (CH)

( * ) Notice: Subject to any disclaimer, the term of this patent is extended or adjusted under 35 U.S.C. 154(b) by 64 days.

(21) Appl. No.: 17/168,413

(22) Filed: Feb. 5, 2021

(65) Prior Publication Data
US 2021/0274673 A1    Sep. 2, 2021

Related U.S. Application Data

(60) Provisional application No. 62/984,041, filed on Mar. 2, 2020.

(51) Int. Cl.
*H05K 7/10* (2006.01)
*H01R 12/71* (2011.01)
*H01R 12/70* (2011.01)

(52) U.S. Cl.
CPC ....... *H05K 7/1084* (2013.01); *H01R 12/7076* (2013.01); *H01R 12/714* (2013.01); *H05K 7/1069* (2013.01); *H05K 7/1092* (2013.01); *H05K 2201/10189* (2013.01); *H05K 2201/10318* (2013.01); *H05K 2201/10325* (2013.01);

(Continued)

(58) Field of Classification Search
CPC ............... H05K 7/1084; H05K 7/1069; H05K 1/10318; H01R 12/7076; H01R 12/714
USPC ............................................ 439/65
See application file for complete search history.

(56) References Cited

U.S. PATENT DOCUMENTS

| 6,867,668 | B1 * | 3/2005 | Dagostino | ............... H01L 23/66 333/260 |
| 8,482,291 | B2 * | 7/2013 | Itoh | ................... H01L 23/49811 257/737 |
| 9,254,653 | B2 * | 2/2016 | Yoda | .................... B41J 2/14233 |

(Continued)

*Primary Examiner* — Alexander Gilman

(57) ABSTRACT

An electronic assembly includes an electronic package connected to a host circuit board. The electronic assembly includes interposer assemblies electrically connected to the electronic package. The electronic assembly includes cable modules coupled to upper separable interface of the interposer assemblies. The electronic assembly includes carrier assemblies configured to be coupled to an upper surface of the electronic package. Each carrier assembly includes a carrier base block and a carrier lid configured to hold at least one interposer assembly and at least one cable module. The carrier assemblies hold the cable modules with the module contacts in electrical connection with upper mating interfaces of the interposer contacts. The carrier assemblies hold lower mating interfaces of the interposer contacts in electrical connection with upper package contacts of the electronic package. The carrier assemblies are separately removable from the electronic package to separate the interposer assemblies from the electronic package.

20 Claims, 21 Drawing Sheets

(52) U.S. Cl.
CPC .............. *H05K 2201/10719* (2013.01); *H05K 2201/10734* (2013.01); *H05K 2201/2018* (2013.01)

(56) References Cited

U.S. PATENT DOCUMENTS

| | | | |
|---|---|---|---|
| 10,218,098 B1* | 2/2019 | Lian | H01L 23/13 |
| 10,756,296 B2* | 8/2020 | Chen | H01L 27/3276 |
| 2003/0218238 A1* | 11/2003 | Kikuchi | H05K 1/0243 |
| | | | 257/678 |
| 2011/0121922 A1* | 5/2011 | Blair | H01P 3/00 |
| | | | 333/238 |
| 2011/0147568 A1* | 6/2011 | Miyake | H05K 7/1061 |
| | | | 361/728 |
| 2016/0351526 A1* | 12/2016 | Boyd | H01L 24/75 |
| 2020/0366017 A1* | 11/2020 | Blackburn | H01R 13/6587 |
| 2020/0388548 A1* | 12/2020 | Blackburn | H01R 12/85 |
| 2021/0183846 A1* | 6/2021 | Smalley | H01L 23/49827 |
| 2021/0274673 A1* | 9/2021 | Blackburn | H05K 7/1084 |
| 2022/0151095 A1* | 5/2022 | Blackburn | H01R 13/24 |

\* cited by examiner

ELECTRONIC ASSEMBLY INCLUDING CABLE MODULES

CROSS REFERENCE TO RELATED APPLICATIONS

This application claims benefit to U.S. Provisional Application No. 62/984,041, filed 2 Mar. 2020, titled "ELECTRONIC ASSEMBLY INCLUDING CABLE MODULES", the subject matter of which is herein incorporated by reference in its entirety.

BACKGROUND OF THE INVENTION

The subject matter herein relates generally to electronic assemblies.

There is an ongoing trend toward smaller, lighter, and higher performance communication components and higher density systems, such as for ethernet switches or other system components. Typically, the system includes a socket connector mounted to a host circuit board. The socket connector receives an electronic package, such as an ASIC. Electrical signals are routed between the ASIC and the host circuit board through the socket connector. The electrical signals are then routed along traces on the host circuit board to another component, such as a transceiver connector. The long electrical paths through the host circuit board reduce electrical performance of the system. Additionally, the routing of the circuits between the socket connector and the other components on the host circuit board occupies board space on the host circuit board. Conventional systems are struggling with meeting signal and power output from the electronic package because there is a need for smaller size and higher number of conductors while maintaining good electrical performance through the system.

A need remains for a reliable electronic assembly for high speed data signaling for data communication systems.

BRIEF DESCRIPTION OF THE INVENTION

In one embodiment, an electronic assembly is provided including an electronic package including a package substrate having an upper surface and a lower surface. The electronic package includes an integrated circuit component mounted to the upper surface of the package substrate. The electronic package includes lower package contacts electrically connected to the integrated circuit component and configured to be electrically connected to a host circuit board. The electronic package includes upper package contacts electrically connected to the integrated circuit component. The electronic assembly includes interposer assemblies electrically connected to the electronic package. Each interposer assembly includes an array of interposer contacts. The interposer contacts are compressible. Each interposer contact has an upper mating interface and a lower mating interface. The lower mating interfaces of the interposer contacts are mated with the upper package contacts. The interposer assemblies define separable interfaces with the electronic package. The electronic assembly includes cable modules coupled to the upper separable interface of the interposer assemblies. Each cable module includes a cable module substrate having module contacts and cables terminated to the cable module substrate being electrically connected to the module contacts. The electronic assembly includes carrier assemblies configured to be coupled to the upper surface of the electronic package. Each carrier assembly includes a carrier base block and a carrier lid. Each carrier assembly is configured to hold at least one interposer assembly and at least one cable module between the carrier base block and the carrier lid. The carrier assemblies holds the cable modules with the module contacts in electrical connection with the upper mating interfaces of the interposer contacts. The carrier assemblies holding the lower mating interfaces of the interposer contacts in electrical connection with the upper package contacts of the electronic package. The carrier assemblies are separately removable from the electronic package to separate the interposer assemblies from the electronic package.

In another embodiment, a carrier assembly for an electronic package of a communication system is provided. The carrier assembly includes a carrier base block having a platform having an upper surface and a lower surface. The platform is configured to be coupled to an upper surface of the electronic package. The platform includes interposer assembly openings therethrough. The interposer assembly openings are formed by base block locating rails. The carrier assembly includes a carrier lid coupled to the upper surface of the carrier base block. The carrier lid includes carrier lid openings aligned with the interposer assembly openings. The carrier lid openings are formed by lid locating rails. The carrier assembly includes interposer assemblies received in the interposer assembly openings of the platform. The interposer assemblies are configured to be electrically connected to the electronic package. Each interposer assembly includes an array of interposer contacts. The interposer contacts are compressible. Each interposer contact has an upper mating interface and a lower mating interface. The lower mating interfaces of the interposer contacts are configured to be mated with package contacts of the electronic package. The interposer assemblies define separable interfaces with the electronic package. The carrier assembly includes cable modules captured between the carrier base block and the carrier lid. The cable modules are coupled to the upper separable interface of the interposer assemblies. Each cable module includes a cable module substrate having module contacts and cables terminated to the cable module substrate being electrically connected to the module contacts. The carrier assembly is removable from the electronic package to separate the interposer assembly from the electronic package.

In a further embodiment, a communication system is provided. The communication system includes a host circuit board having an upper surface. The host circuit board includes board contacts. The communication system includes a socket connector mounted to the upper surface. The socket connector includes socket contacts electrically connected to the board contacts. The communication system includes an electronic assembly coupled to the socket connector. The electronic assembly includes an electronic package including a package substrate having an upper surface and a lower surface. The electronic package includes an integrated circuit component mounted to the upper surface of the package substrate. The electronic package includes lower package contacts electrically connected to the integrated circuit component. The lower package contacts are electrically connected to the socket contacts of the socket connector. The electronic package includes upper package contacts electrically connected to the integrated circuit component. The electronic assembly includes interposer assemblies electrically connected to the electronic package. Each interposer assembly includes an array of interposer contacts. The interposer contacts are compressible. Each interposer contact has an upper mating interface and a lower mating interface. The lower mating interfaces of the interposer contacts are mated with the upper package contacts. The interposer assemblies define separable interfaces with the electronic package. The electronic assembly includes cable modules coupled to the upper separable interface of the interposer assemblies. Each cable module includes a cable module substrate having module contacts and cables terminated to the cable module substrate being electrically connected to the module contacts. The electronic assembly includes carrier assemblies configured to be coupled to the upper surface of the electronic package. Each carrier assembly includes a carrier base block and a carrier lid. Each carrier assembly is configured to hold at least one interposer assembly and at least one cable module between the carrier base block and the carrier lid. The carrier assemblies hold the cable modules with the module contacts in electrical connection with the upper mating interfaces of the interposer contacts. The carrier assemblies hold the lower mating interfaces of the interposer contacts in electrical connection with the upper package contacts of the electronic package. The carrier assemblies re separately removable from the electronic package from each other to separate the interposer assemblies from the electronic package.

DETAILED DESCRIPTION OF THE INVENTION

Figure 1:
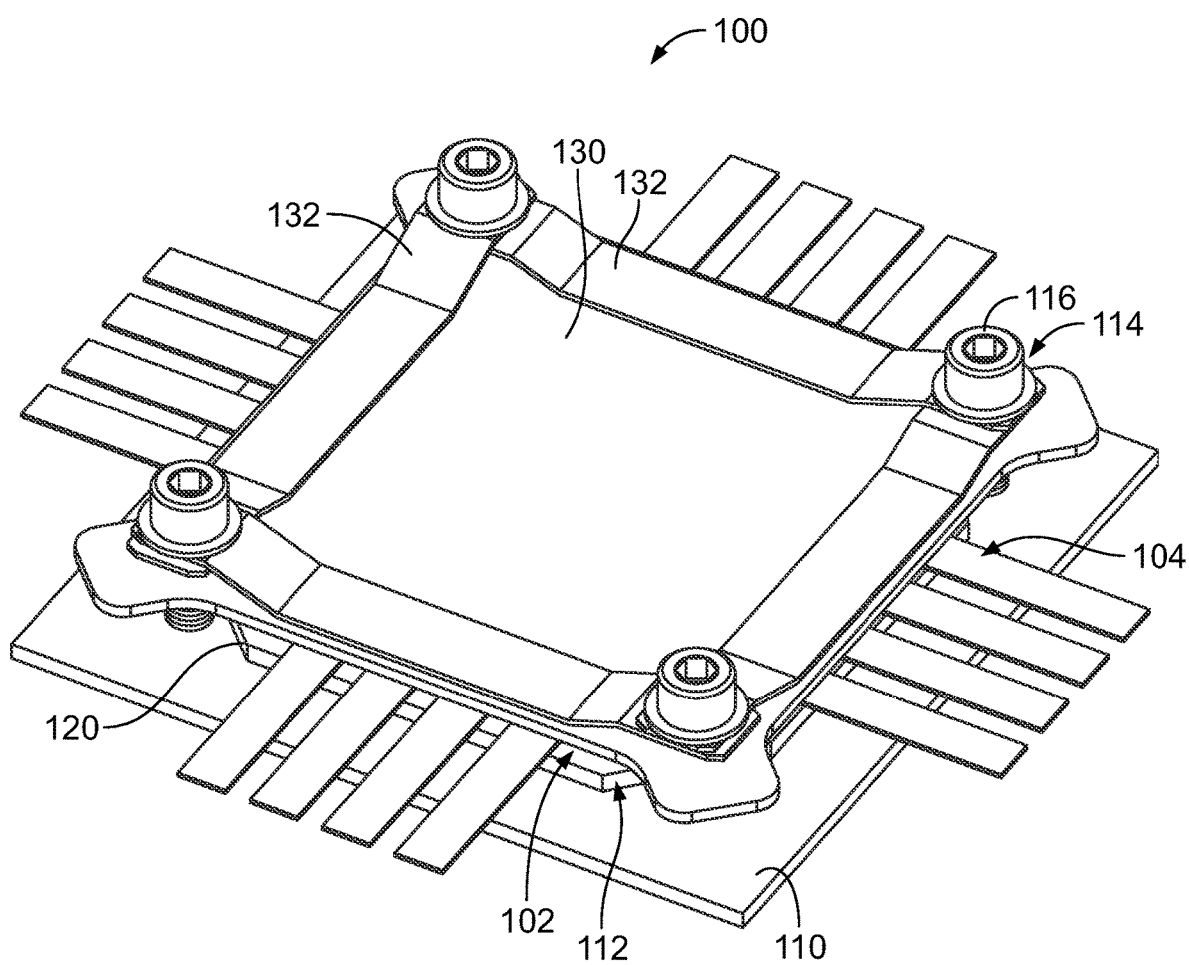
FIG. 1 is a perspective view of a communication system having an electronic assembly in accordance with an exemplary embodiment.
Figure 2:
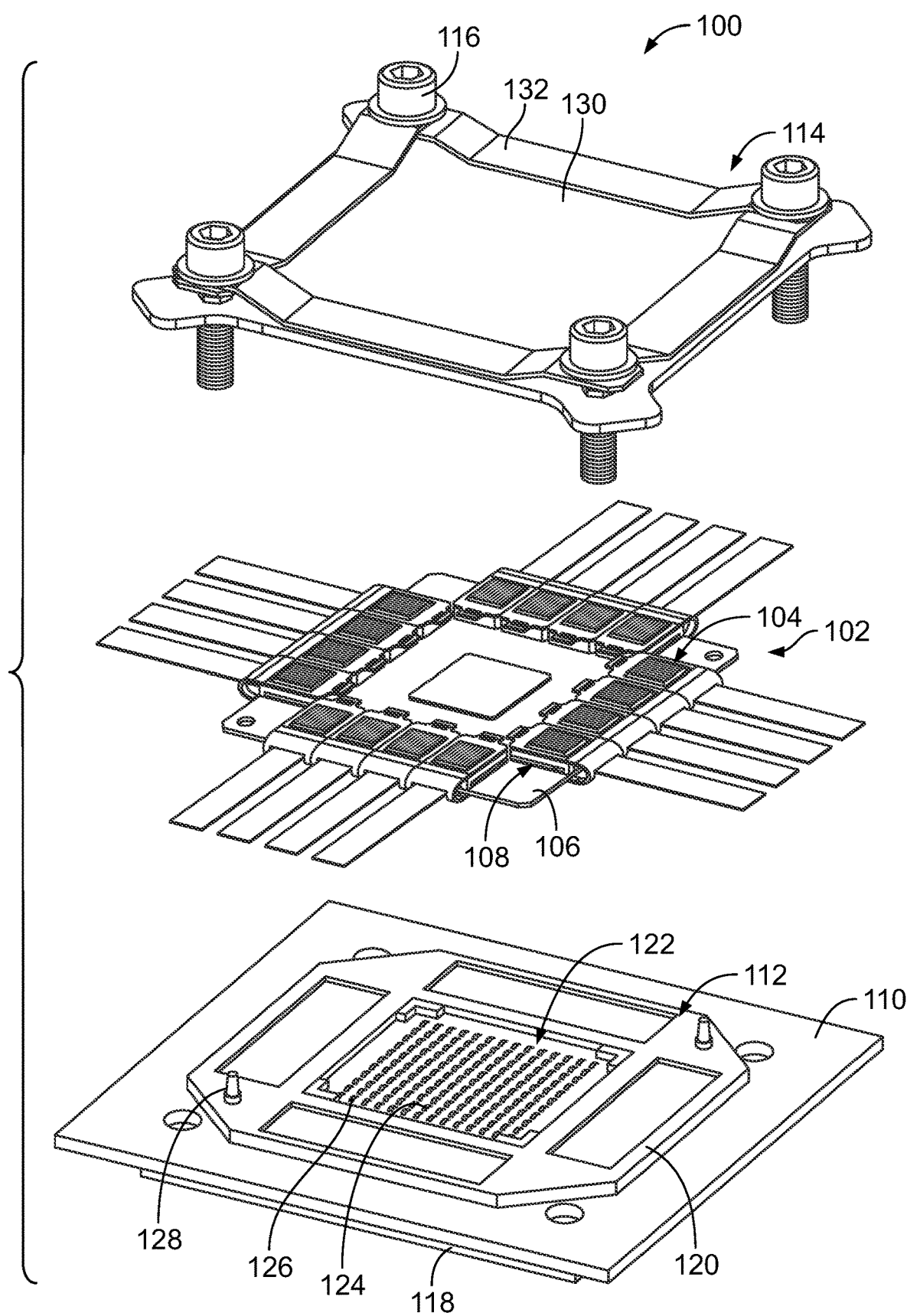
FIG. 2 is an exploded view of the communication system and the electronic assembly in accordance with an exemplary embodiment.

FIG. 1 is a perspective view of a communication system 100 having an electronic assembly 102 in accordance with an exemplary embodiment. FIG. 2 is an exploded view of the communication system 100 and the electronic assembly 102 in accordance with an exemplary embodiment. The electronic assembly 102 includes cable modules 104 (FIG. 2) electrically connected to an electronic package 106 (FIG. 2) by interposer assemblies 108 (FIG. 2). The electronic assembly 102 is electrically connected to a host circuit board 110, such as using a socket connector 112. In other various embodiments, the electronic assembly 102 is mounted directly to the host circuit board 110 without the use of the socket connector 112. In an exemplary embodiment, a compression assembly 114 is used to load the electronic assembly 102 to the socket connector 112 to electrically connect the electronic package 106 to the socket connector 112. For example, compression hardware 116, such as threaded fasteners, may be coupled to a bolster plate 118 below the host circuit board 110 to couple the compression assembly 114 to the host circuit board 110 and the electronic assembly 102. In an exemplary embodiment, the communication system 100 includes a heat sink (not shown) provided to dissipate heat from the electronic package 106 and/or the cable modules 104.

In various embodiments, the electronic package 106 is an integrated circuit assembly, such as an ASIC. However, the electronic package 106 may be another type of communication component. The cable modules 104 are mated directly to the ASIC via the interposer assemblies 108 independent of the host circuit board 110. For example, high-speed data signals are transmitted between the electronic package 106 and the cable modules 104 via the interposer assemblies 108 without the high-speed data signals passing through the host circuit board 110. In an exemplary embodiment, a plurality of cable modules 104 are coupled to the electronic package 106. For example, the cable modules 104 may be provided on multiple sides of the integrated circuit or other communication element of the electronic package 106. In the illustrated embodiment, the cable modules 104 are provided on all four sides of the integrated circuit. Other arrangements are possible in alternative embodiments. The cable modules 104 are individually clamped or compressed against the interposer assemblies 108 and are thus individually serviceable and removable from the electronic package 106.

The socket connector 112 includes a socket frame 120 having a socket opening 122. The socket connector 112 includes a socket substrate 124 are received in the socket opening 122. In the illustrated embodiment, the socket frame 120 surrounds the socket opening 122 on all four sides of the socket opening 122. The socket frame 120 may have a different shape in alternative embodiments. The bottom of the socket substrate 124 is mounted to the host circuit board 110 at a board interface. For example, the socket substrate 124 may be electrically connected to the host circuit board 110 by a ball grid array (BGA), a land grid array (LGA), or another mating interface. The socket connector 112 includes socket contacts 126 at the top of the socket substrate 124. In an exemplary embodiment, the socket contacts 126 are compressible contacts, such as spring beams, configured to be electrically connected to the electronic package 106. The compression assembly 114 may compress the socket contacts 126 when the compression assembly 114 is mounted to the host circuit board 110. In an exemplary embodiment, the socket connector 112 includes guide members 128 to guide mating of the electronic package 106 with the socket connector 112. For example, the guide members 128 may be guide pins extending from the top of the socket frame 120. Other types of guide members may be used in alternative embodiments.

The compression assembly 114 is coupled to the top of the electronic assembly 102 to mechanically and electrically connect the electronic assembly 102 to the socket connector 112. The compression assembly 114 includes a load plate 130 that is coupled to the bolster plate 118 by the compression hardware 116. The load plate 130 transfers the compression load to the electronic assembly 102. In an exemplary embodiment, the compression assembly 114 includes compression members 132 engaging the load plate 130. The compression members 132 are coupled to the compression hardware 116. In the illustrated embodiment, the compression members 132 are spring members configured to transfer spring forces from the compression hardware 116 to the load plate 130. Other types of compression members may be used in alternative embodiments. In the illustrated embodiment, the compression members 132 are provided on all four sides of the load plate 130; however, the compression members 132 may be coupled to other areas of the load plate 130 in alternative embodiments.

When assembled, the load plate 130 presses downward against the electronic assembly 102 to press the electronic package 106 against the socket contacts 126. The electronic package 106 compresses the socket contacts 126. The load plate 130 may be compressed against the integrated circuit or the substrate of the electronic package. In an exemplary embodiment, the load plate 130 may be compressed against the cable modules 104. The load plate 130 may press the cable modules 104 into the interposer assemblies 108. The compressive forces from the load plate 130 may be transferred to the socket contacts 126 through the compressive forces applied to the individual cable modules 104. In an exemplary embodiment, the load plate 130 may be thermally coupled to the cable modules 104. The load plate 130 may define a heat spreader for dissipating heat from the cable modules 104. The load plate 130 may be thermally coupled to the integrated circuit or other component of the electronic package 106. The load plate 130 may dissipate heat from the integrated circuit or other component of the electronic package 106. Optionally, a heat sink (not shown) may be thermally coupled to the load plate 130. In other various embodiments, the load plate 130 may include fins or other heat dissipating fins extending therefrom to dissipate heat directly into the air or environment around the communication system 100. In other various embodiments, heat pipes, a cold plate, or other heat dissipating structure may be thermally coupled to the load plate 130 to dissipate heat from the load plate 130.

Figure 3:
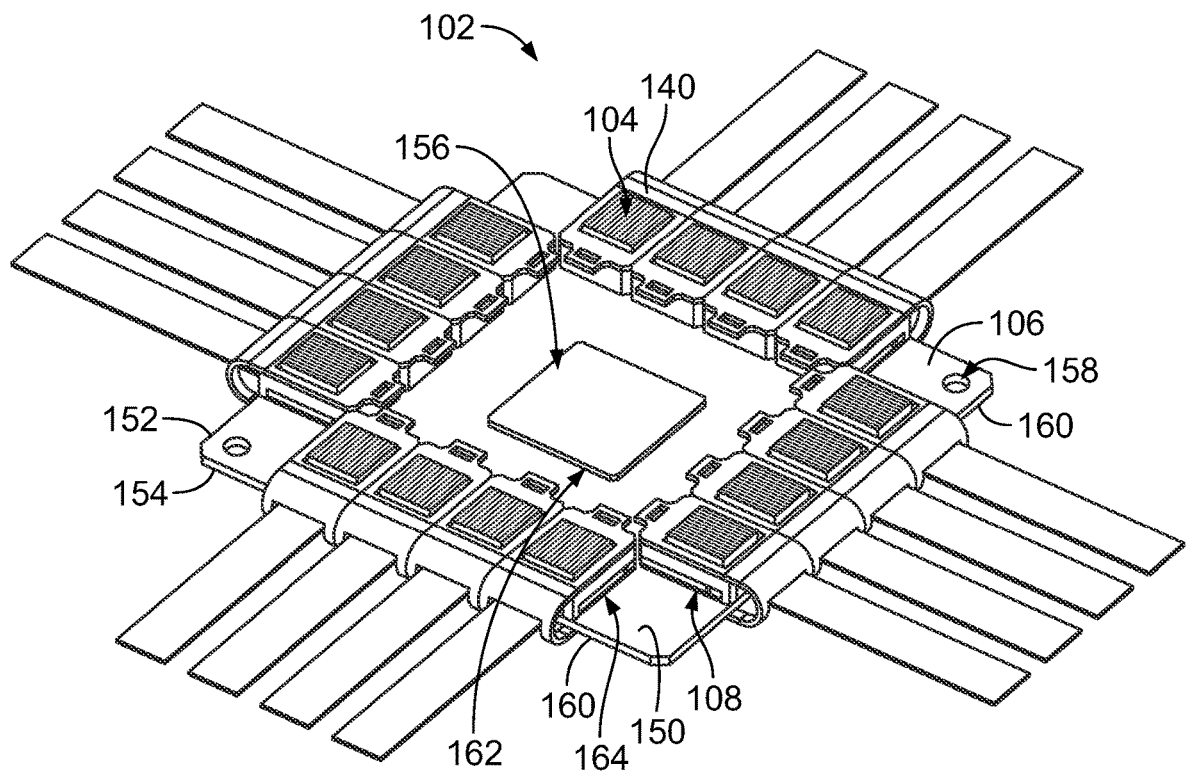
FIG. 3 is a perspective view of the electronic assembly in accordance with an exemplary embodiment.

FIG. 3 is a perspective view of the electronic assembly 102 in accordance with an exemplary embodiment. The electronic assembly 102 includes the electronic package 106 supporting a plurality of the cable modules 104. The interposer assemblies 108 electrically connect the cable modules 104 to the electronic package 106. In an exemplary embodiment, electronic assembly 102 includes cable module compression members 140 used to couple the cable modules 104 to the electronic package 106. The cable module compression members 140 compress the interposer assemblies 108 between the cable modules 104 and the electronic package 106.

In an exemplary embodiment, the interposer assemblies 108 define separable mating interfaces. For example, each interposer assembly 108 includes an upper separable mating interface, such as a compressible interface. As such, the cable modules 104 may be removable or replaceable. For example, during a testing process, each cable module 104 may be individually tested and adjusted or replaced to ensure that the electronic assembly is functional prior to assembly with the socket connector 112 (shown in FIG. 1). Each interposer assembly 108 may include a lower separable mating interface, such as a compressible interface. The contacts of the interposer assembly 108 may be compressible columnar contacts, such as conductive elastomeric contacts. In other embodiments, the contacts of the interposer assembly 108 may be stamped and formed contacts, such as including spring beams. The spring beams may be provided at the top and/or the bottom of the interposer assembly 108. The contacts may be press fit contacts, solder contacts, or other types of contacts in alternative embodiments. In various embodiments, a plurality of interposer assemblies 108 are mounted to the electronic package 106. For example, each cable module 104 is mounted to a separate interposer assembly 108. In alternative embodiments, a plurality of cable modules 104 may be mounted to a single interposer assembly 108. For example, separate interposer assemblies 108 may be provided along each side of the electronic package 106. In another embodiment, a single interposer assembly is provided extending along all four sides of the electronic package 106.

The electronic package 106 includes a package substrate 150 having an upper surface 152 and a lower surface 154. The electronic package 106 includes an integrated circuit component 156 mounted to the upper surface 152 of the package substrate 150. The integrated circuit component 156 may be a chip, an ASIC, a processor, a memory module or another component mounted to the top of the package substrate 150. In the illustrated embodiment, the integrated circuit component 156 is rectangular and approximately centered on the package substrate 150; however, the integrated circuit component 156 may have other shapes or locations in alternative embodiments. In an exemplary embodiment, the package substrate 150 includes locating features 158 for locating the electronic package 106 relative to the socket connector 112 (shown in FIG. 2). In the illustrated embodiment, the locating features 158 are openings through the package substrate 150. Other types of locating features may be used in alternative embodiments, such as channels, dimples, extensions, tabs, posts, pins, and the like.

The package substrate 150 includes edges 160 extending around the perimeter of the package substrate 150. In the illustrated embodiment, the package substrate 150 is rectangular shape having four perpendicular edges. The package substrate 150 may have other shapes including greater or fewer edges 160 in alternative embodiments. The integrated circuit component 156 is mounted to the package substrate 150 at a component mounting area 162, which may be approximately centered between the edges 160. The package substrate 150 includes package contacts (not shown) at the component mounting area 162 used to electrically connect the integrated circuit component 156 to the package substrate 150. The package contacts may be pads, traces, vias, and the like.

The package substrate 150 includes lower package contacts (not shown) at the lower surface 154 of the package substrate 150. The lower package contacts are used to electrically connect the electronic package 106 to the socket connector 112. For example, the lower package contacts are electrically connected to corresponding socket contacts 126 (shown in FIG. 2). In an exemplary embodiment, power and low-speed data signals are transmitted through the lower package contacts between the package substrate 150 and the socket connector 112. High speed data signals may additionally be transmitted through the lower package contacts. The lower package contacts are electrically connected to the integrated circuit component 156 via corresponding package contacts. In an exemplary embodiment, the lower package contacts may be approximately centered along the lower surface 154, such as directly below the component mounting area 162.

The package substrate 150 includes upper package contacts (not shown) at the upper surface 152 of the package substrate 150. The upper package contacts are used to electrically connect the electronic package 106 to the cable modules 104 via the interposer assemblies 108. In an exemplary embodiment, high-speed data signals are transmitted through the upper package contacts between the package substrate 150 and the cable modules 104. The upper package contacts are electrically connected to the integrated circuit component 156 via corresponding package contacts. In an exemplary embodiment, the upper package contacts are provided around the outer periphery of the package substrate 150. In an exemplary embodiment, the package substrate 150 includes mounting areas 164 around the outer periphery of the package substrate 150. The interposer assemblies 108 and the cable modules 104 are coupled to the package substrate 150 at the mounting areas 164. The mounting areas 164 are located between the integrated circuit component 156 at the component mounting area 162 and the edges 160. In the illustrated embodiment, the mounting areas 164 are provided along all four sides of the integrated circuit component 156 for the purpose of achieving short electrical traces (improved signal integrity) to/from the integrated circuit component 156.

The electronic assembly 102 has high channel density for data communication and power distribution to the integrated circuit component 156. For example, data channels are provided on both the upper surface 152 and the lower surface 154 of the package substrate 150. A subset of the data signals, such as the low speed and/or sideband data signals, are routed through the bottom of the electronic package 106 to the host circuit board 110 and a subset of the data signals, such as the high speed data signals, are routed through the top of the electronic package 106 to the cable modules 104. The performance and design efficiency are enhanced by increasing the number of data channels to the integrated circuit component 156. Furthermore, by routing the high-speed data signals directly to the cable modules 104, rather than routing the high-speed data signals through the host circuit board 110, the performance of the communication system 100 is enhanced. In an exemplary embodiment, the cable modules 104 are coupled to the electronic package 106 at multiple locations (e.g., at four sides of the chip) to increase density of the communication system 100 and shorten electrical paths of the communication system 100. The arrangement reduces the number of interfaces needed along the bottom of the package substrate 150 by routing the data channels to the top of the package substrate 150 for digital-to-optical conversion and take off by the cable modules 104. The cable modules 104 are individually separable from the electronic package 106 using the interposer assemblies 108. Each cable module 104 has its own compressive mating force using the corresponding cable module compression member 140. The cable module compression members 140 can be removed to service an individual cable module 104, such as to adjust or replace the cable module 104 after testing.

Figure 4:
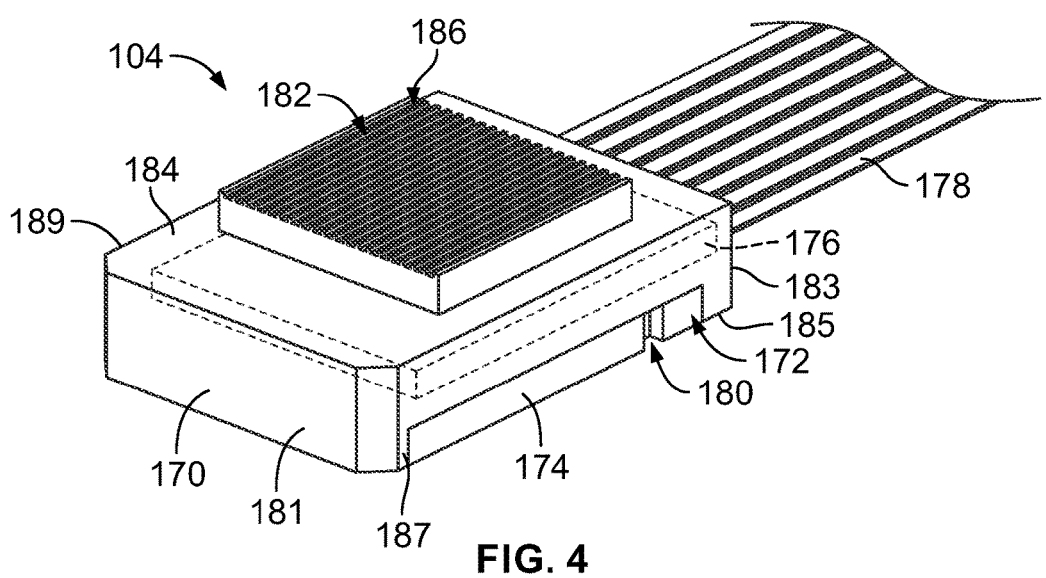
FIG. 4 is a perspective view of an optical module of the electronic assembly in accordance with an exemplary embodiment.

FIG. 4 is a perspective view of the cable module 104 in accordance with an exemplary embodiment. The cable module 104 includes an cable module housing 170 having a cavity 172 that receives an cable module substrate 174 and an optical engine 176 (shown in phantom). The cable module 104 includes one or more optical cables 178 extending from a rear 183 of the cable module housing 170. The optical cables 178 are terminated to the optical engine 176 and/or the cable module substrate 174. The optical cables 178 may be fiber-optic cables in various embodiments and may be direct attached or separable.

The cable module substrate 174 extends between a front 181 and a rear 183 of the cable module 104. The cable module substrate 174 is provided at a bottom 185 of the cable module 104. The cable module substrate 174 extends between sides 187, 189 of the cable module 104. The cable module substrate 174 may be a printed circuit board or other suitable material for routing electrical traces. The cable module substrate 174 includes module contacts (not shown) configured to be electrically connected to the interposer assembly 108 (shown in FIG. 3). For example, the module contacts may be pads on the bottom of the cable module substrate 174. In an exemplary embodiment, the cable module substrate 174 includes locating features 180 configured to locate the cable module 104 relative to the interposer assembly 108. In the illustrated embodiment, the locating features 180 are openings, such as holes in the cable module substrate 174. Other types of locating features 180 may be provided in alternative embodiments, such as protrusions or pins extending from the cable module substrate 174. The locating features 180 may be provided on another structure, such as the cable module housing 170 in alternative embodiments.

The optical engine 176 (shown in phantom in FIG. 4) is coupled to the cable module substrate 174, such as to the top of the cable module substrate 174. The optical engine 176 processes the electrical data signals. In an exemplary embodiment, the optical engine 176 includes an electrical-to-optical converter configured to convert between electrical signals and optical signals. The optical engine 176 may include other electrical components.

In an exemplary embodiment, the cable module 104 includes an cable module heat sink 182 for dissipating heat from the optical engine 176. The cable module heat sink 182 extends from the cable module housing 170. In an exemplary embodiment, the cable module heat sink 182 may be integral with the cable module housing 170. For example, the cable module housing 170 may be molded or otherwise formed to include the cable module heat sink 182. The cable module heat sink 182 may be a conductive thermoplastic material. In alternative embodiments, the cable module heat sink 182 may be separate and discrete from the cable module housing 170, such as being separately coupled to the cable module housing 170. The cable module heat sink 182 may be manufactured from a different material than the cable module housing 170, such as being manufactured from metal. In the illustrated embodiment, the cable module heat sink 182 is provided at a top 184 of the cable module housing 170. The cable module heat sink 182 includes a thermal interface 186 configured to be thermally coupled to another heat transfer component, such as the load plate 130 (shown in FIG. 1). Optionally, the thermal interface 186 may be compressible and/or deformable for engaging the heat transfer component. The cable module heat sink 182 may include plates, such as interleaved plates that are movable relative to each other. In alternative embodiments, the cable module heat sink 182 may include heat transfer fins or other heat dissipating elements.

Figure 5:
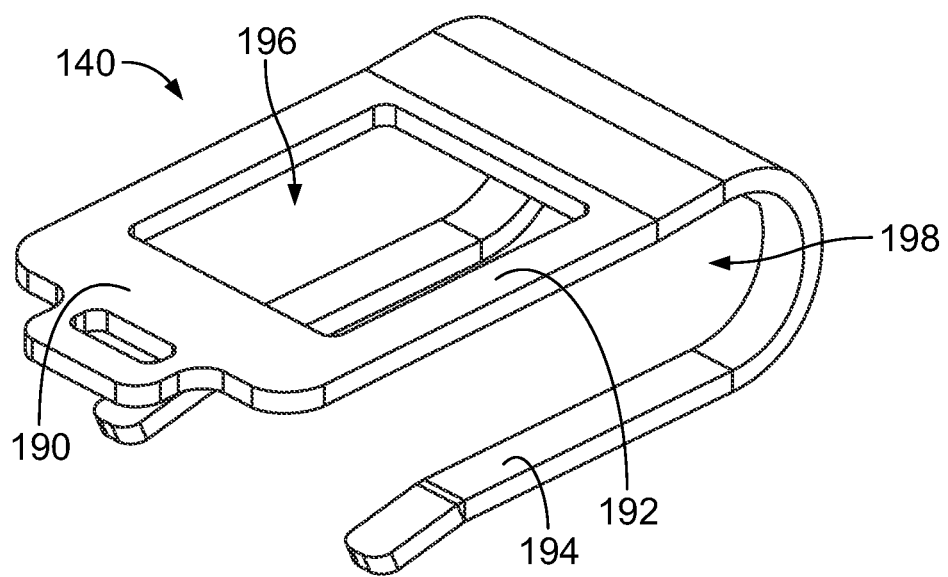
FIG. 5 is a perspective view of an optical module compression member of the electronic assembly in accordance with an exemplary embodiment.

FIG. 5 is a perspective view of the cable module compression member 140 in accordance with an exemplary embodiment. The cable module compression member 140 includes a biasing member 190 configured to engage the cable module 104 (shown in FIG. 3) to press downward against the cable module 104. In the illustrated embodiment, the cable module compression member 140 is a spring clip configured to be coupled to the cable module 104 and the electronic package 106 (shown in FIG. 3). Other types of compression elements may be used in alternative embodiments.

The cable module compression member 140 includes an upper arm 192 and a lower arm 194. The lower arm 194 is configured to engage the electronic package 106. The upper arm 192 defines the biasing member 190 configured to engage the cable module 104. In an exemplary embodiment, the upper arm 192 includes an opening 196 configured to receive the cable module heat sink 182 (shown in FIG. 4). In an exemplary embodiment, the lower arm 194 includes an opening 198 configured to receive the optical cables 178 (shown in FIG. 4). The cable module compression member 140 may have other shapes in alternative embodiments.

Figure 6:
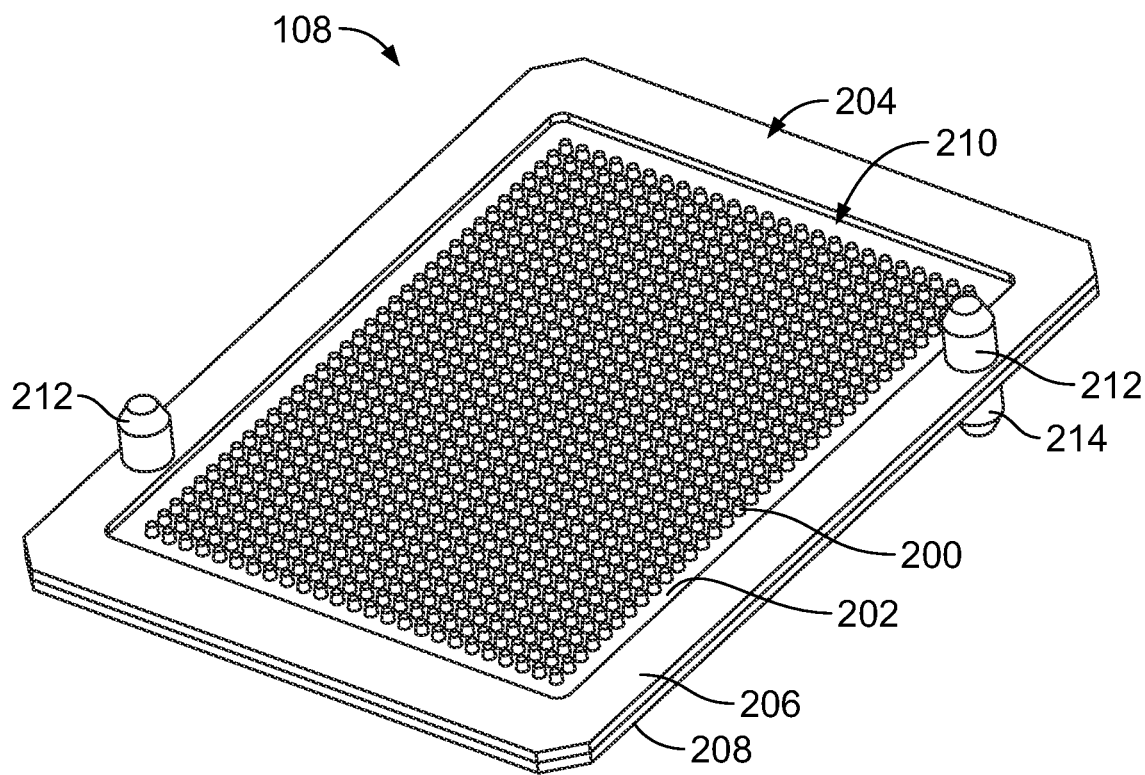
FIG. 6 is a perspective view of an interposer assembly of the electronic assembly in accordance with an exemplary embodiment.

FIG. 6 is a perspective view of the interposer assembly 108 in accordance with an exemplary embodiment. The interposer assembly 108 includes an array of interposer contacts 200 held together by a support plate 202 the interposer assembly 108 includes an interposer frame 204 holding the support plate 202 and the interposer contacts 200.

In an exemplary embodiment, the interposer frame 204 is a multipiece frame having an upper frame member 206 and a lower frame member 208. The support plate 202 is sandwiched between the upper frame member 206 and the lower frame member 208. In the illustrated embodiment, the interposer frame 204 extends around an outer periphery of the interposer assembly 108, such as along all four sides of the support plate 202. The interposer frame 204 may have other shapes in alternative embodiments. The interposer frame 204 includes openings 210 in the upper frame member 206 and the lower frame member 208. The openings 210 receive the interposer contacts 200.

In an exemplary embodiment, the interposer frame 204 includes upper locating pins 212 and lower locating pins 214. The upper locating pins 212 extend upward from the upper frame member 206. The upper locating pins 212 are used for locating the cable module 104 (shown in FIG. 4) relative to the interposer assembly 108. The upper locating pins 212 are received in the locating features 180 (shown in FIG. 4) of the cable module 104 to position the cable module 104 relative to the interposer frame 204 and the interposer contacts 200. The lower locating pins 214 extend downward from the lower frame member 208. The lower locating pins 214 are used for locating the interposer assembly 108 relative to the electronic package 106 (shown in FIG. 3). The lower locating pins 214 are received in the package substrate 150 (shown in FIG. 3) to position the interposer frame 204 and the interposer contacts 200 relative to the package substrate 150. Other types of locating features other than the locating pins 212, 214 may be used in alternative embodiments.

Figure 7:
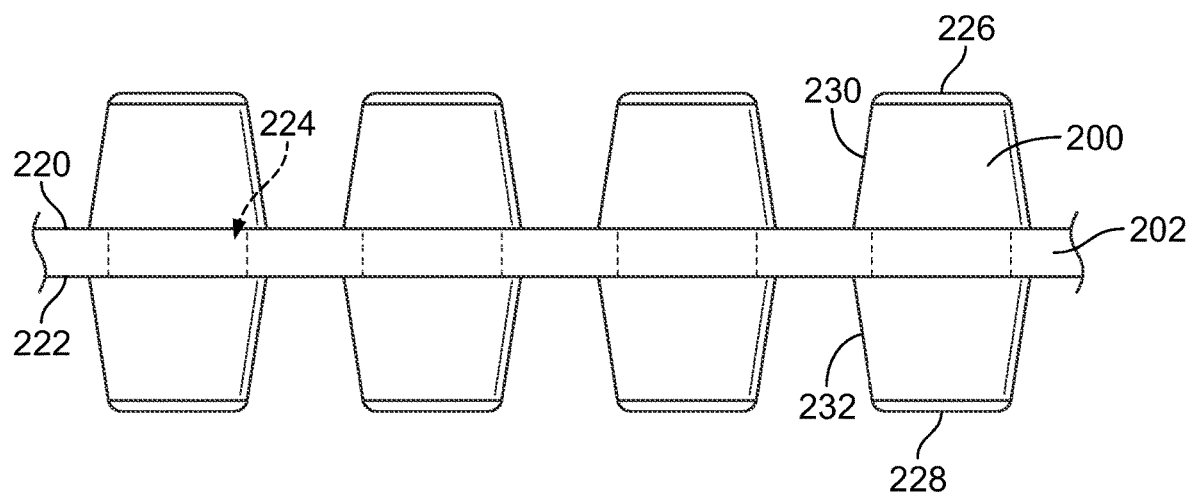
FIG. 7 is a side view of a portion of the interposer assembly in accordance with an exemplary embodiment.

FIG. 7 is a side view of a portion of the interposer assembly 108 showing the support plate 202 and a plurality of the interposer contacts 200. In an exemplary embodiment, the support plate 202 is a film having an upper surface 220 and a lower surface 222. The support plate 202 includes openings 224 therethrough holding corresponding interposer contacts 200. The support plate 202 is manufactured from an insulative material, such as a polyimide material, to electrically isolate the interposer contacts 200 from one another.

The interposer contacts 200 are held by the support plate 202. In an exemplary embodiment, the interposer contacts 200 are compressible contacts, such as conductive polymer columns. Each interposer contact 200 includes an upper mating interface 226 and a lower mating interface 228. The upper mating interface 226 is located above the upper surface 220 of the support plate 202 and the lower mating interface 228 is located below the lower surface 222 of the support plate 202. The interposer contacts 200 are compressible between the upper mating interfaces 226 and the lower mating interfaces 228. Optionally, the upper and lower mating interfaces 226, 228 may be planar interfaces oriented parallel to each other. Optionally, upper and lower sides 230, 232 of the interposer contacts 200 may be tapered. For example, the sides 230, 232 may be oriented nonparallel to the upper and lower mating interfaces 226, 228. The upper and lower portions of the interposer contacts 200 may be cone-shaped, such as being frusto-conical. Other types of interposer contacts 200 may be utilized in alternative embodiments.

Figure 8:
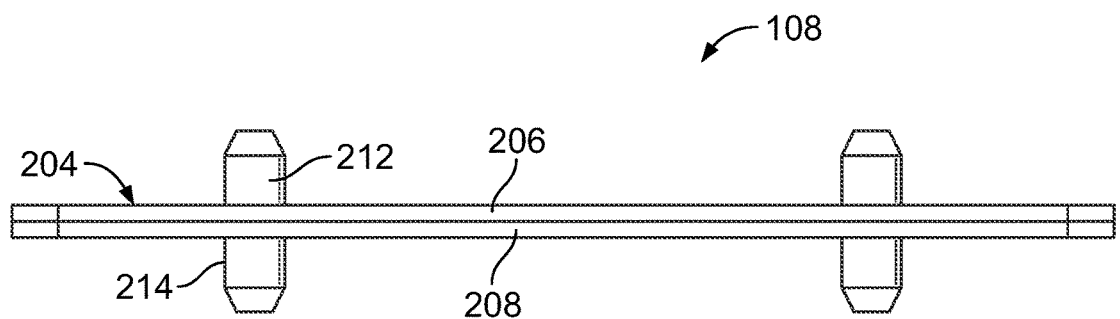
FIG. 8 is a side view of the interposer assembly in accordance with an exemplary embodiment.

FIG. 8 is a side view of the interposer assembly 108 in accordance with an exemplary embodiment. FIG. 8 illustrates the interposer frame 204 showing the upper frame member 206 and the lower frame member 208. The upper locating pins 212 extend from the upper frame member 206. The lower locating pins 214 extend from the lower frame member 208. Optionally, the upper locating pins 212 may be aligned with the lower locating pins 214. In alternative embodiments, the upper locating pins 212 may be offset relative to the lower locating pins 214.

Figure 9:
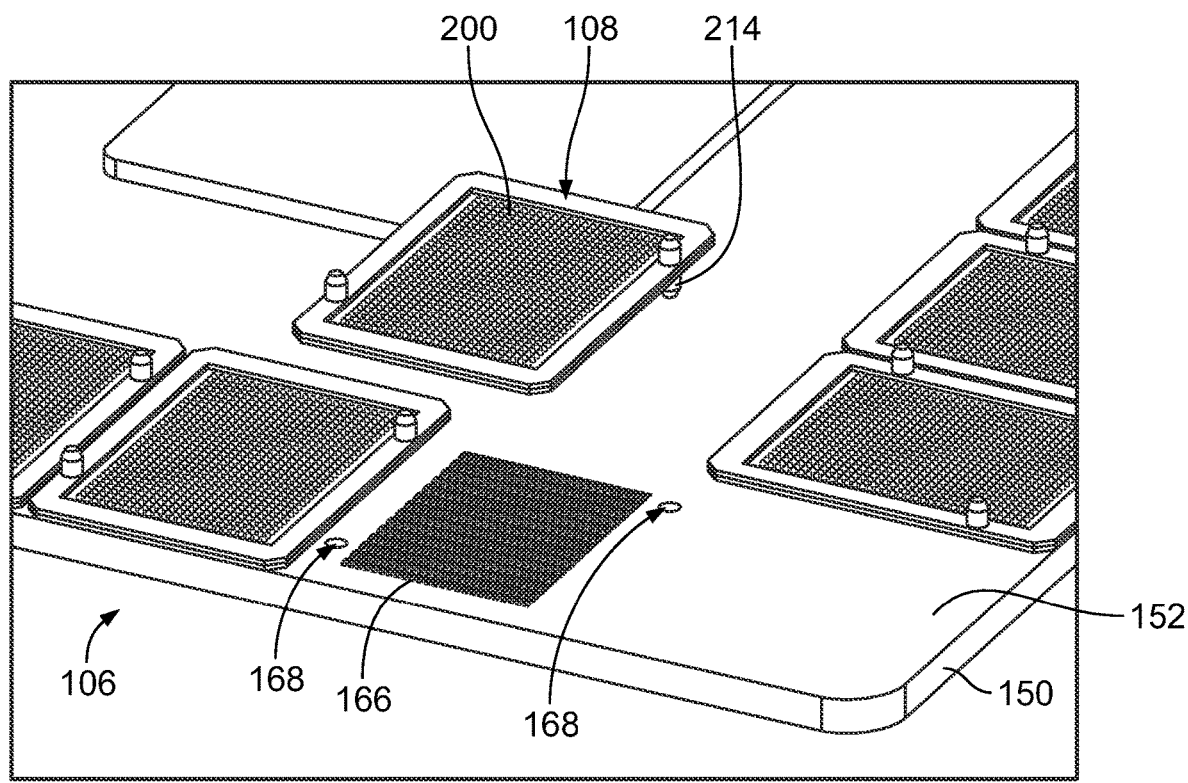
FIG. 9 is a perspective view of a portion of the electronic assembly in accordance with an exemplary embodiment.

FIG. 9 is a perspective view of a portion of the electronic assembly 102 in accordance with an exemplary embodiment showing one of the interposer assemblies 108 poised for mating with the electronic package 106. The package substrate 150 includes a plurality of upper package contacts 166 on the upper surface 152 of the package substrate 150. The upper package contacts 166 are arranged in an array complementary to the array of interposer contacts 200. The upper package contacts 166 may be signal contacts and/or ground contacts and/or power contacts.

The package substrate 150 includes interposer locating features 168 for locating the interposer assembly 108 relative to the electronic package 106. In the illustrated embodiment, the interposer locating features 168 are openings in the package substrate 150 configured to receive the lower locating pins 214 of the interposer assembly 108. Other types of locating features may be used in alternative embodiments, such as protrusions, posts, and the like.

In an exemplary embodiment, the interposer locating features 168 and the lower locating pins 214 are arranged to allow mating of the interposer assembly 108 in different orientations. For example, the interposer assembly 108 may be mounted in a first orientation as illustrated in FIG. 9. The interposer assembly 108 may be mounted in a second orientation rotated 180° from the first orientation with the lower locating pins 214 received in different interposer locating features 168. The interposer assembly 108 may be flipped or inverted upside down to a third orientation and coupled to the package substrate 150 (or may then be rotated 180° to a fourth orientation). The arrangement of the interposer contacts 200 and the upper package contacts 166 are arranged to accommodate the different mating orientations. In alternative embodiments, the interposer locating features 168 and the lower locating pins 214 may be oriented for keyed mating of the interposer assembly 108 with the electronic package 106 in a single orientation.

Figure 10:
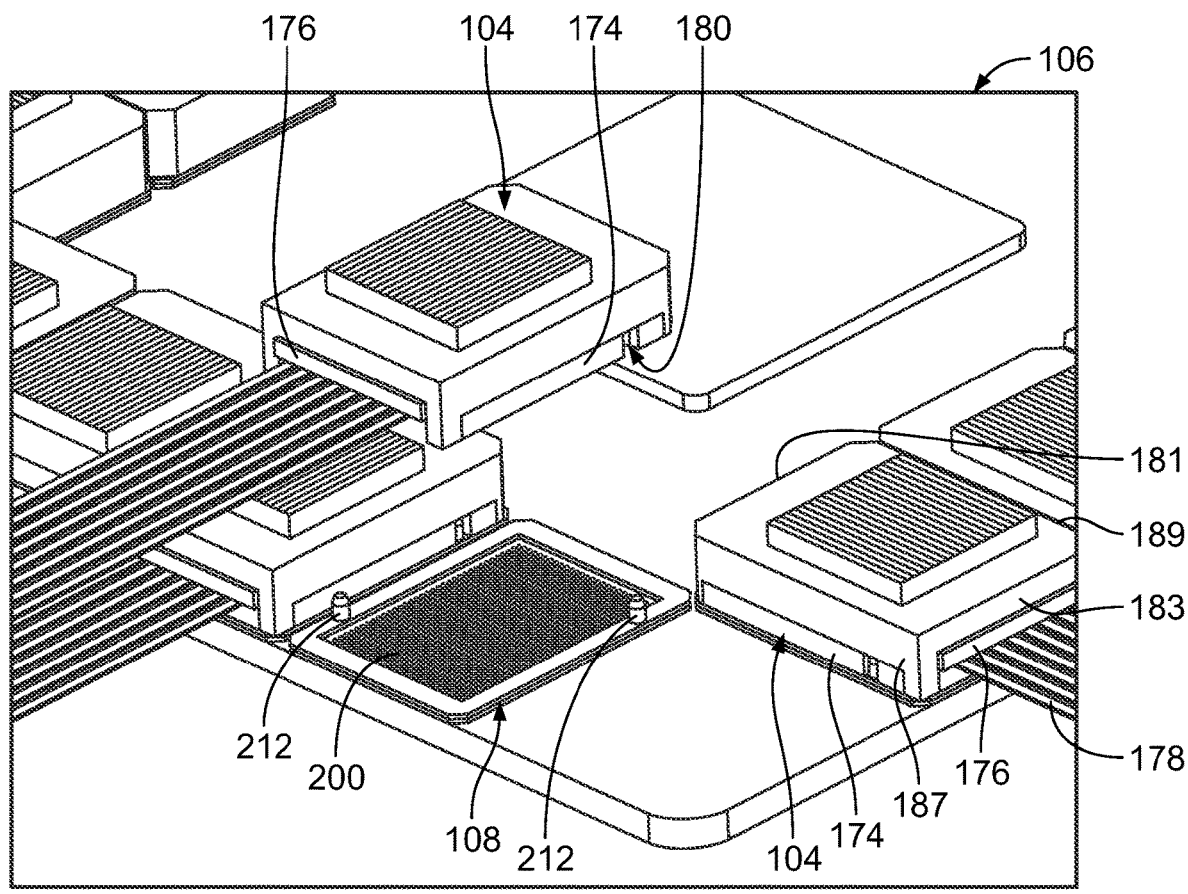
FIG. 10 is a perspective view of a portion of the electronic assembly in accordance with an exemplary embodiment.

FIG. 10 is a perspective view of a portion of the electronic assembly 102 in accordance with an exemplary embodiment showing one of the cable modules 104 poised for mating with the corresponding interposer assembly 108 and the electronic package 106. The locating features 180 of the cable module 104 are aligned with the upper locating pins 212 to locate the cable module 104 relative to the interposer assembly 108. The cable module substrate 174 is configured to be coupled to the interposer contacts 200 of the interposer assembly 108. For example, the cable module contacts on the bottom surface of the cable module substrate 174 are aligned with and coupled to corresponding interposer contacts 200. The cable module substrate 174 electrically connects the interposer contacts 200 with the optical engine 176. The optical engine 176 couples the optical cables 178 with the interposer contacts 200 via of the cable module substrate 174.

The cable modules 104 are arranged in cable module sets 191. The optical fibers 178 of each cable module 104 within the cable module set 191 extend in a common direction (for example, from the same side of the electronic package 106). The cable modules 104 are mounted to the electronic package 106 such that fronts 181 and rears 183 of the cable modules 104 within each cable module set 191 are aligned. The sides 187, 189 of the cable modules 104 within the cable module set 191 face each other and may abut against each other.

Figure 11:
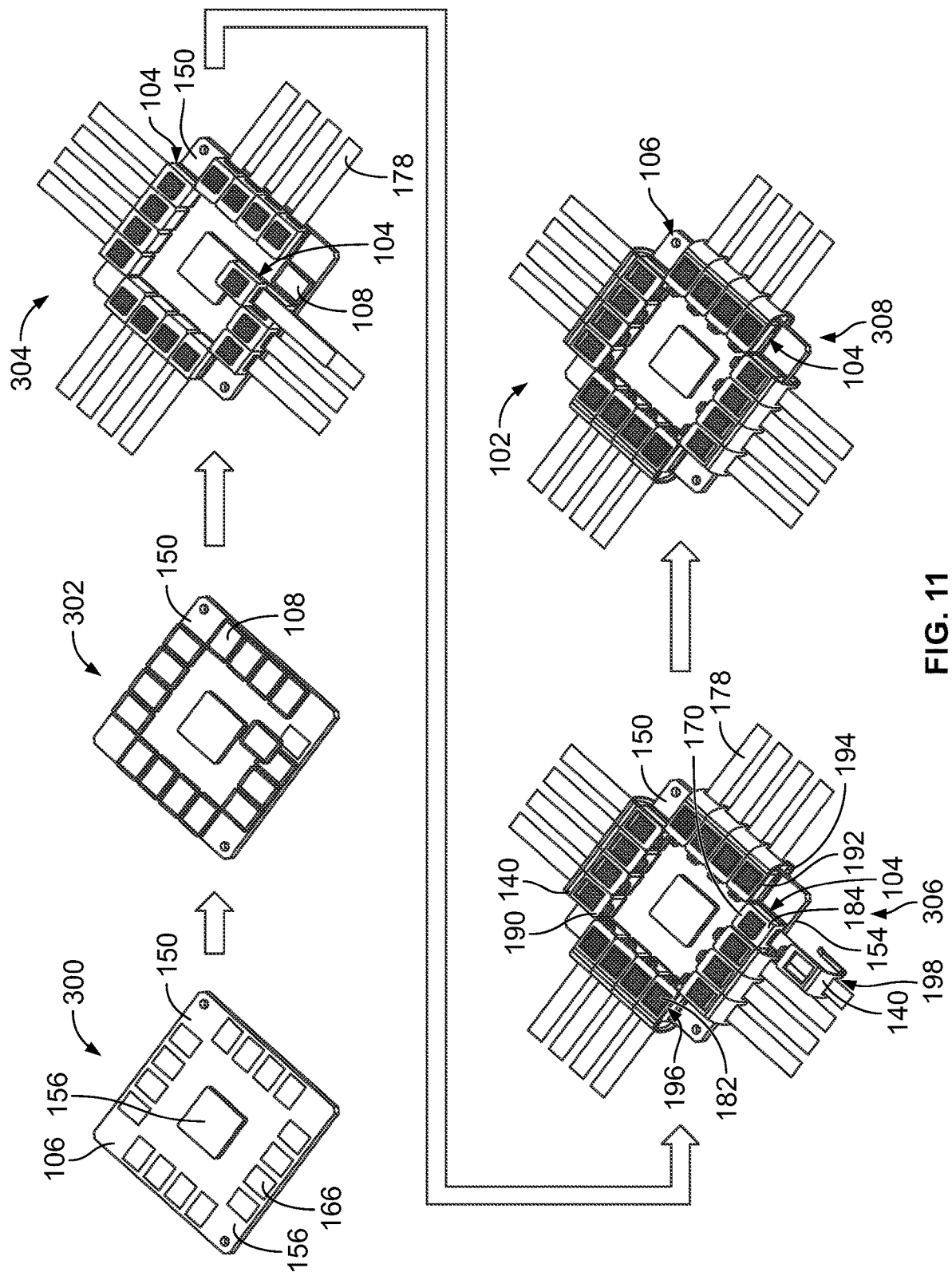
FIG. 11 is a flowchart showing assembly of the electronic assembly in accordance with an exemplary embodiment.

FIG. 11 is a flowchart showing assembly of the electronic assembly 102 in accordance with an exemplary embodiment. At 300, the electronic package 106 is provided including the integrated circuit component 156 and the upper package contacts 166 on the upper surface 152 of the package substrate 150. At 302, the interposer assemblies 108 are coupled to the package substrate 150. At 304, the cable modules 104 are coupled to the interposer assemblies 108. In the illustrated embodiment, the optical cables 178 extend generally horizontally from the electronic package 106, thus limiting the height of the electronic assembly 102.

At 306, the cable module compression members 140 are coupled to the cable modules 104. For example, the cable module compression members 140 are clipped onto the cable modules 104. The upper arms 192 of the cable module compression members 140 engage the top 184 of the corresponding cable module housing 170. The lower arm 194 engages the lower surface 154 of the package substrate 150. The cable module compression members 140 compressed the cable modules 104 downward against the interposer assemblies 108. The optical cables 178 extend from the sides of the electronic package 106, such as all four sides of the electronic package 106. In an exemplary embodiment, the cable module compression members 140 have sufficient compression forces to compress the interposer contacts 200. For example, the cable modules 104 are pressed downward by the biasing members 190 of the cable module compression members 140 to compress the interposer contacts 200 between the cable modules 104 and the electronic package 106. In an exemplary embodiment, the upper arm 192 engages the top 184 of the cable module housing 170 at multiple locations, such as around an entire periphery of the top 184 to spread the compressive forces around the entire cable module 104. In an exemplary embodiment, the opening 196 in the upper arm 192 receives the cable module heat sink 182. In an exemplary embodiment, the opening 198 in the lower arm 194 receives the optical cables 178.

At 308, the electronic assembly 102 is fully assembled. In an exemplary embodiment, the electronic assembly 102 may be tested, such as to test the electrical connections between each of the cable modules 104 and the interposer assemblies 108 and/or to test the electrical connections between each of the interposer assemblies 108 and the electronic package 106 area the testing may be performed prior to assembling the electronic assembly 102 with the socket connector 112, such as in a testing device, such as prior to shipping or sale of the electronic assembly 102.

Figure 12:
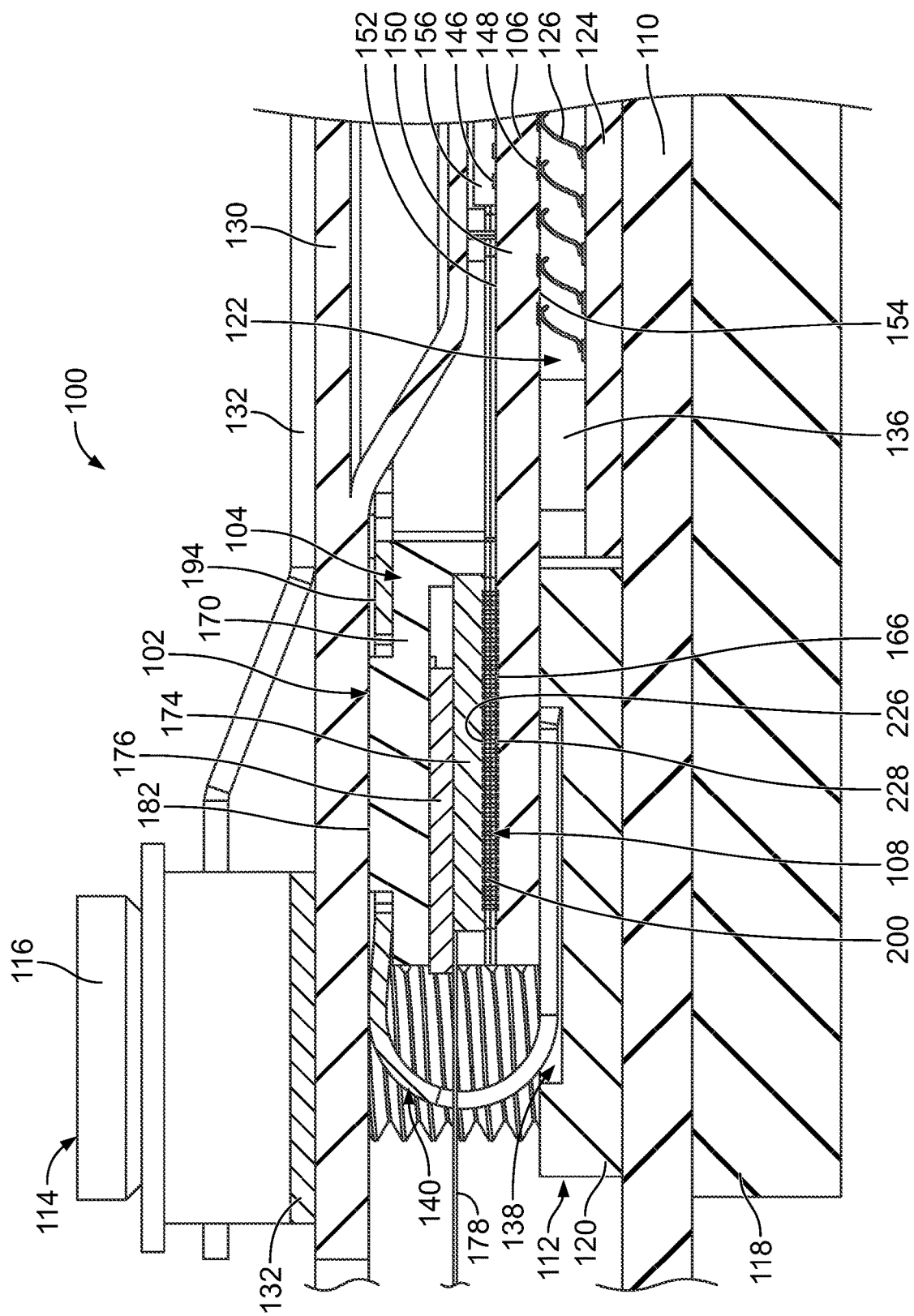
FIG. 12 is a cross-sectional view of a portion of the communication system showing the electronic assembly in accordance with an exemplary embodiment.

FIG. 12 is a cross-sectional view of a portion of the communication system 100 showing the electronic assembly 102 coupled to the socket connector 112 and the host circuit board 110. During assembly, the socket connector 112 is electrically connected to the host circuit board 110 at the board interface. The socket frame 120 is mounted to the top of the host circuit board 110. The socket substrate 124 is received in the socket opening 122 and electrically connected to the host circuit board 110. In an exemplary embodiment, the socket substrate 124 is connected to the host circuit board 110 using a BGA, a LGA, and the like. The socket frame 120 positions the socket substrate 124 relative to the host circuit board 110.

During assembly, the electronic assembly 102 is coupled to the socket connector 112. For example, the package substrate 150 is mounted to the top of the socket frame 120. The electronic assembly 102 is positioned to electrically connect the package substrate 150 with the socket contacts 126. In an exemplary embodiment, the socket connector 112 includes stop members 136 at the top of the socket substrate 124. The stop members 136 support the electronic package 106 relative to the socket substrate 124, such as to limit compression of the socket contacts 126 when the electronic package 106 is coupled to the socket connector 112.

In the illustrated embodiment, the socket contacts 126 are spring beams extending from the top of the socket substrate 124 defining a mating interface for mating with the electronic package 106. The spring beams are compressible to maintain electrical connection between the socket contacts 126 and the electronic package 106. In an exemplary embodiment, the compression assembly 114 is used to compress the electronic assembly 102 into the socket connector 112. The compression assembly 114 presses the electronic assembly 102 downward to compress the socket contacts 126.

In an exemplary embodiment, the electronic package 106 includes lower package contacts 148 along the lower surface 154 of the package substrate 150. The lower package contacts 148 are electrically connected to corresponding socket contacts 126. In the illustrated embodiment, the lower package contacts 148 are contact pads provided on the lower surface 154 of the package substrate 150. The lower package contacts 148 are electrically connected to package contacts 146 of the electronic package 106. The package contacts 146 are provided on the upper surface 152. The package contacts 146 are electrically connected to the integrated circuit component 156. In an exemplary embodiment, power and low-speed data signals are transmitted between the lower package contacts 148 and corresponding package contacts 146. In an exemplary embodiment, the upper package contacts 166 are electrically connected to corresponding package contacts 146. In various embodiments, the upper package contacts 166 may be electrically connected to corresponding lower package contacts 148. For example, power may be supplied to the cable module 104 along traces between corresponding upper package contacts 166 and lower package contacts 148.

When assembled, the cable module compression members 140 are coupled to the cable modules 104 to press the cable modules 104 downward. In an exemplary embodiment, the lower arm 194 is received in a pocket 138 at the top of the socket frame 120 such that the package substrate 150 may rest on the top of the socket frame 120. The cable module compression members 140 create a reliable electrical connection between the cable module 104 and the interposer assembly 108 and create a reliable electrical connection between the interposer assembly 108 and the package substrate 150. The interposer contacts 200 are compressed between the cable module 104 and the package substrate 150. The upper mating interfaces 226 of the interposer contacts 200 are electrically connected to cable module contacts 175 at the bottom of the cable module substrate 174. The lower mating interfaces 228 of the interposer contacts 200 are electrically connected to the upper package contacts 166 at the upper surface 152 of the package substrate 150. The optical engine 176 provides an interface between the cable module substrate 174 and the optical cables 178.

During assembly, the compression assembly 114 is used to compress the electronic assembly 102 against the socket connector 112. For example, the load plate 130 may be compressed against the integrated circuit component 156. In an exemplary embodiment, the load plate 130 defines a heat sink configured to dissipate heat from the integrated circuit component 156. The load plate 130 is loaded by (for example, pressed downward by) the compression members 132. The compression members 132 are compressed downward using the compression hardware 116, which is threadably coupled to the bolster plate 118. As the compression hardware 116 is tightened, the compression members 132 are compressed and pressed downward against the load plate 130. The load plate 130 is similarly pressed downward against the electronic assembly 102. In an exemplary embodiment, the compression assembly 114 is used to compress the cable modules 104 against the interposer assemblies 108. For example, the load plate 130 may pressed downward against the cable module compression members 140 and/or the cable module housing 170 and/or the cable module heat sink 182 to press the cable module 104 downward into the interposer assembly 108. In an exemplary embodiment, the load plate 130 is in thermal engagement with the cable module heat sink 182 to dissipate heat from the cable module 104. The load plate 130 functions as a heat sink for the cable module 104. The load plate 130 provides a clamping force for the electronic assembly 102 to the socket connector 112 and provides a clamping force for multiple cable modules 104. The load plate 130 defines an integrated, unified heat sinking surface for the cable modules 104 while allowing a separate and discrete force to be applied to the cable modules 104 for compressing the interposer assemblies 108.

Figure 13:
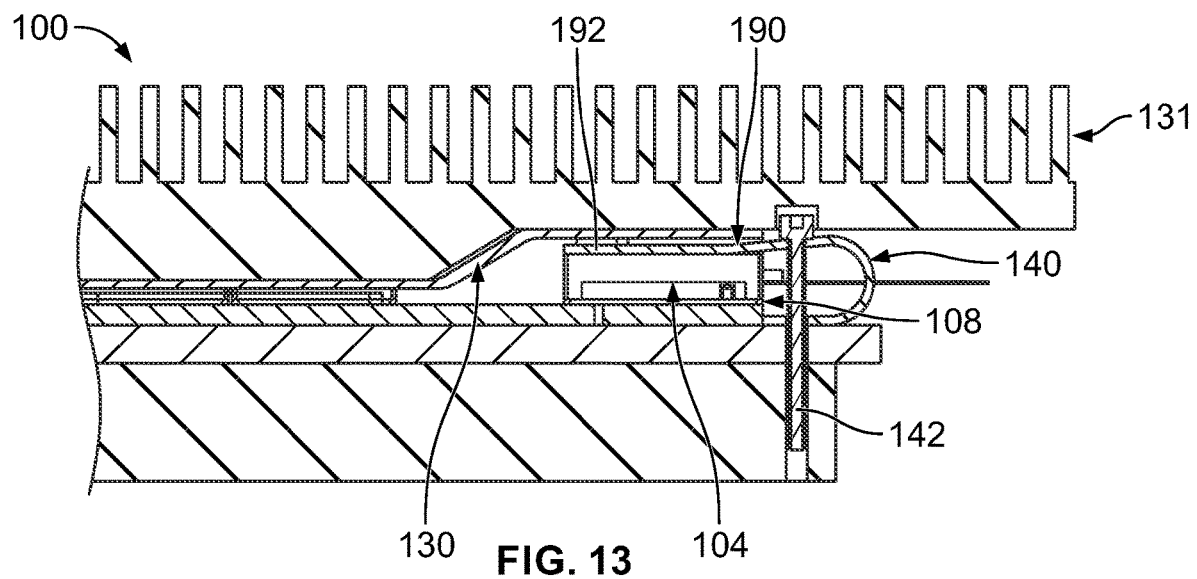
FIG. 13 is a cross-sectional view of a portion of the communication system in accordance with an exemplary embodiment.

FIG. 13 is a cross-sectional view of a portion of the communication system 100 in accordance with an exemplary embodiment. In the illustrated embodiment, the cable module compression member 140 includes cable module compression hardware 142 coupled to the biasing member 190 to provide downward biasing force on the biasing member 190. For example, the cable module compression hardware 142 engages the upper arm 192 to press downward on the upper arm 192. The downward pressure on the upper arm 192 is transferred to the cable module 104 to press the cable module 104 downward against the interposer assembly 108. In an exemplary embodiment, the communication system 100 includes a heat sink 131 coupled to or integral with the load plate 130.

Figure 14:
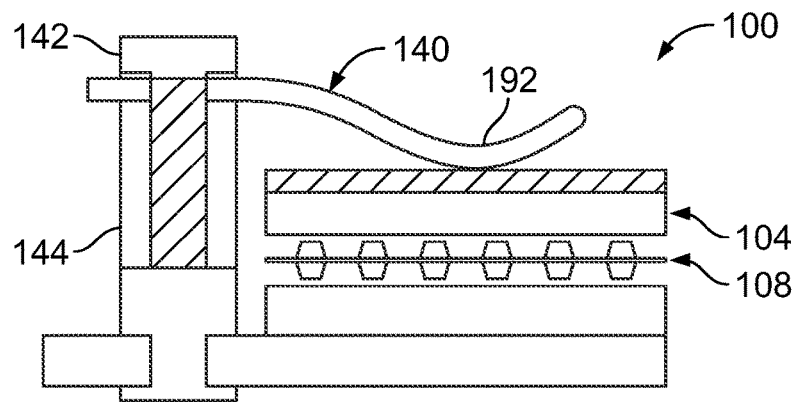
FIG. 14 is a cross-sectional view of a portion of the communication system in accordance with an exemplary embodiment.

FIG. 14 is a cross-sectional view of a portion of the communication system 100 in accordance with an exemplary embodiment. In the illustrated embodiment, the cable module compression member 140 is provided without the lower arm 194 (shown in FIG. 12). The cable module compression member 140 utilizes the cable module compression hardware 142 to engage in pressed downward on the upper arm 192. In an exemplary embodiment, the cable module compression hardware 142 is received in a threaded insert 144. As the compression hardware 142 is tightened into the threaded insert 144, the upper arm 192 provides downward biasing force on the cable module 104 to press the cable module 104 downward against the interposer assembly 108.

Figure 15:
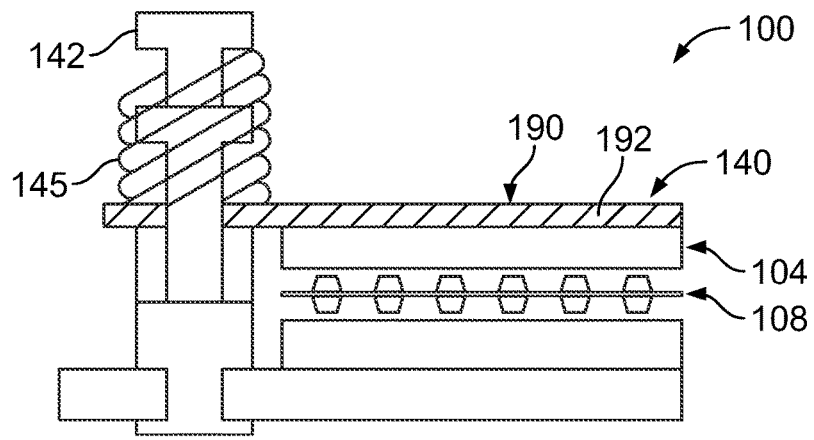
FIG. 15 is a cross-sectional view of a portion of the communication system in accordance with an exemplary embodiment.

FIG. 15 is a cross-sectional view of a portion of the communication system 100 in accordance with an exemplary embodiment. In the illustrated embodiment, the cable module compression member 140 it is provided without the lower arm 194 (shown in FIG. 12). The cable module compression member 140 utilizes a spring member 145, such as a coil spring, between the cable module compression hardware 142 and the upper arm 192 of the biasing member 190. As the compression hardware 142 is tightened, the coil spring is compressed and forced downward against the upper arm 192, which provides downward biasing force on the cable module 104 to press the cable module 104 downward against the interposer assembly 108.

Figure 16:
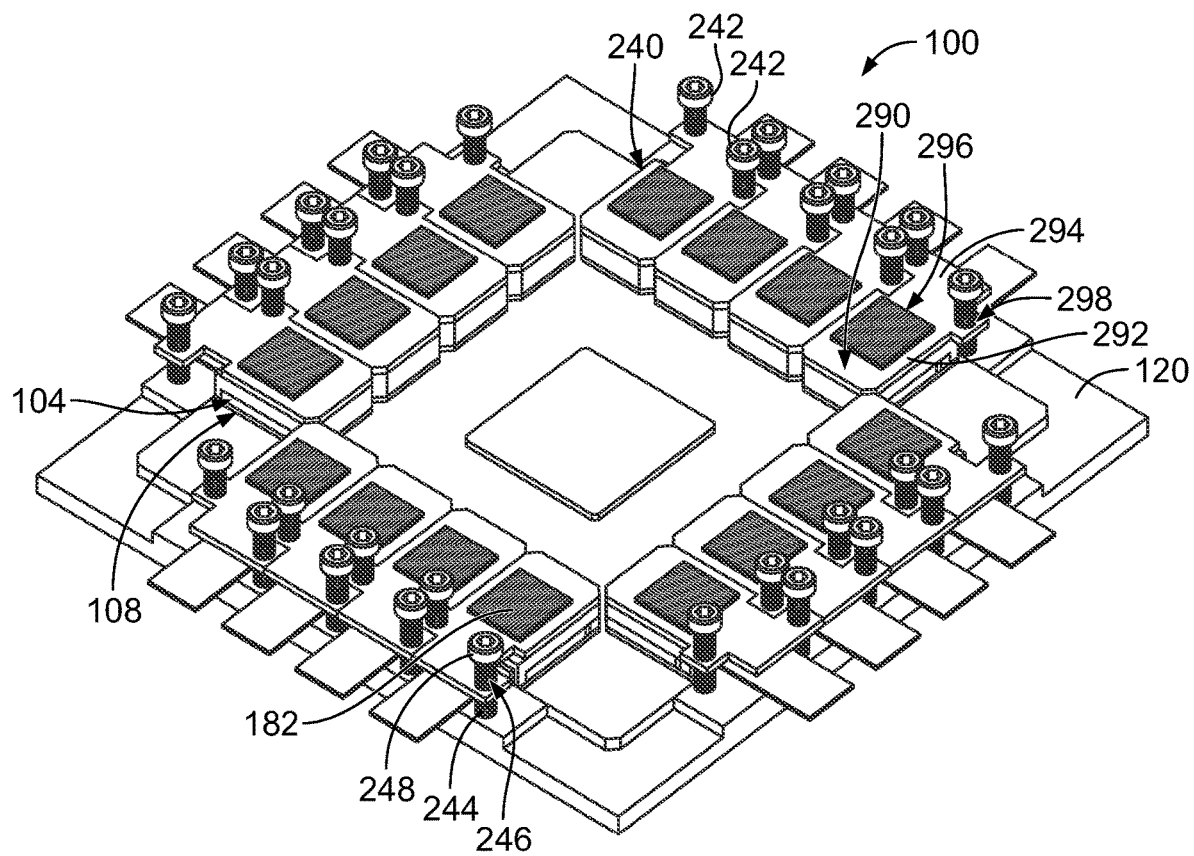
FIG. 16 is a perspective view of a portion of the communication system in accordance with an exemplary embodiment.
Figure 17:
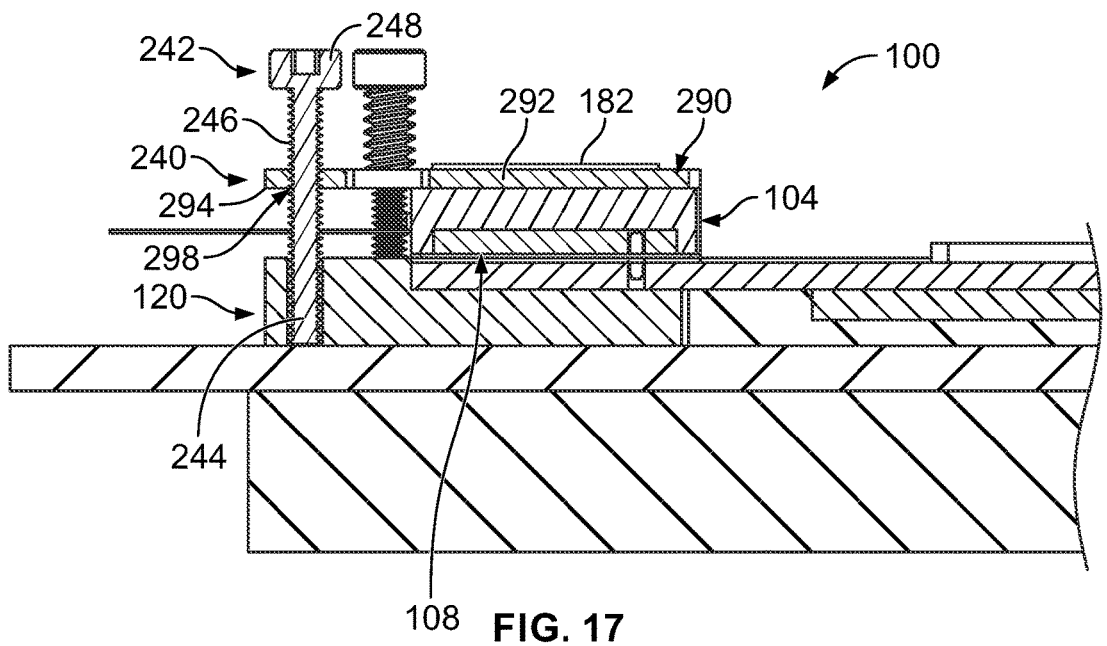
FIG. 17 is a cross-sectional view of a portion of the communication system in accordance with an exemplary embodiment.

FIG. 16 is a perspective view of a portion of the communication system 100 in accordance with an exemplary embodiment, showing alternative cable module compression members 240 used to compress the cable modules 104 against the interposer assemblies 108. FIG. 17 is a cross-sectional view of a portion of the communication system 100 including the cable module compression members 240.

Each cable module compression member 240 includes a biasing member 290 engaging the top of the cable module 104. In the illustrated embodiment, the biasing member 290 includes a plate 292 engaging the top of the cable module 104 and an extension 294 extending from the plate 292. The plate 292 includes an opening 296 that receives the cable module heat sink 182. The extension 294 includes openings 298 that receive cable module compression hardware 242. In the illustrated embodiment, the cable module compression hardware 242 includes a threaded fastener 244 having a spring member 246 captured between a head 248 of the threaded fastener 244 and the biasing member 290. The spring member 246 presses the biasing member 290 downward against the cable module 104. In the illustrated embodiment, the threaded fasteners 244 are threadably coupled to the socket frame 120.

In an exemplary embodiment, an electronic assembly is provided including an electronic package including a package substrate having an upper surface and a lower surface, the electronic package including an integrated circuit component mounted to the upper surface of the package substrate, the electronic package includes lower package contacts electrically connected to the integrated circuit component and configured to be electrically connected to a host circuit board, the electronic package includes upper package contacts electrically connected to the integrated circuit component; an interposer assembly including an array of interposer contacts, the interposer contacts being compressible, each interposer contact having an upper mating interface and a lower mating interface, the lower mating interfaces of the interposer contacts are mated with the upper package contacts; cable modules coupled to the upper surface of the package substrate, each cable module including an cable module substrate having module contacts and an optical engine mounted to the cable module substrate electrically connected to the module contacts, the cable module being mounted to the interposer assembly such that the module contacts are electrically connected to the upper mating interfaces of the interposer contacts, each cable module including at least one optical fiber terminated to the optical engine; and cable module compression members coupled to the cable modules, the cable module compression members compressing the compressible interposer contacts between the cable modules and the electronic package.

In various embodiments, the cable module compression member includes a spring clip compressing the cable module against the interposer assembly. In various embodiments, the cable module compression member includes a spring clip including an upper arm and a lower arm, the upper arm engaging the cable module, the lower arm engaging the lower surface of the package substrate to compress the cable module against the interposer contacts. In various embodiments, the cable module compression member includes a compression plate and compression hardware engaging and pressing the compression plate downward onto the cable module. In various embodiments, the cable module compression member includes a spring element and compression hardware engaging the spring element and pressing the spring element downward into the cable module.

In an exemplary embodiment, a communication system is provided including a socket connector includes a socket frame having a socket opening receiving a socket substrate, the socket substrate including socket contacts, the socket contacts being compressible, the socket connector configured to be mounted to a host circuit board, the socket substrate being electrically connected to the host circuit board at a board interface; an electronic assembly coupled to the socket connector, the electronic assembly including an electronic package including a package substrate having an upper surface and a lower surface, the electronic package including an integrated circuit component mounted to the upper surface of the package substrate, the electronic package includes lower package contacts electrically connected to the integrated circuit component, the lower package contacts being electrically connected to the socket contacts, the electronic package includes upper package contacts electrically connected to the integrated circuit component, the electronic assembly including an interposer assembly including an array of interposer contacts, the interposer contacts being compressible, each interposer contact having an upper mating interface and a lower mating interface, the lower mating interfaces of the interposer contacts are mated with the upper package contacts, the electronic assembly including cable modules coupled to the upper surface of the package substrate, each cable module including an cable module substrate having module contacts and an optical engine mounted to the cable module substrate electrically connected to the module contacts, the cable module being mounted to the interposer assembly such that the module contacts are electrically connected to the upper mating interfaces of the interposer contacts, each cable module including at least one optical fiber terminated to the optical engine; and a compression assembly including a load plate mounted to the electronic assembly, the compression assembly including a compression member engaging the load plate to press the load plate downward, the load plate being coupled to the electronic package to compress the socket contacts and electrically connect the lower package contacts to the socket contacts.

In various embodiments, the load plate engages the cable module to compress the cable module downward toward the interposer assembly. In various embodiments, the cable module includes an cable module heatsink engaging in dissipating heat from the optical engine, the load plate being thermally conductive, the load plate engaging the cable module heatsink of each of the cable modules to dissipate heat from the cable module heat sinks. In various embodiments, the socket contacts transmit power and low speed signals between the host circuit board and the electronic package, the interposer assembly transmitting high speed signals between the electronic package and the cable modules.

Figure 18:
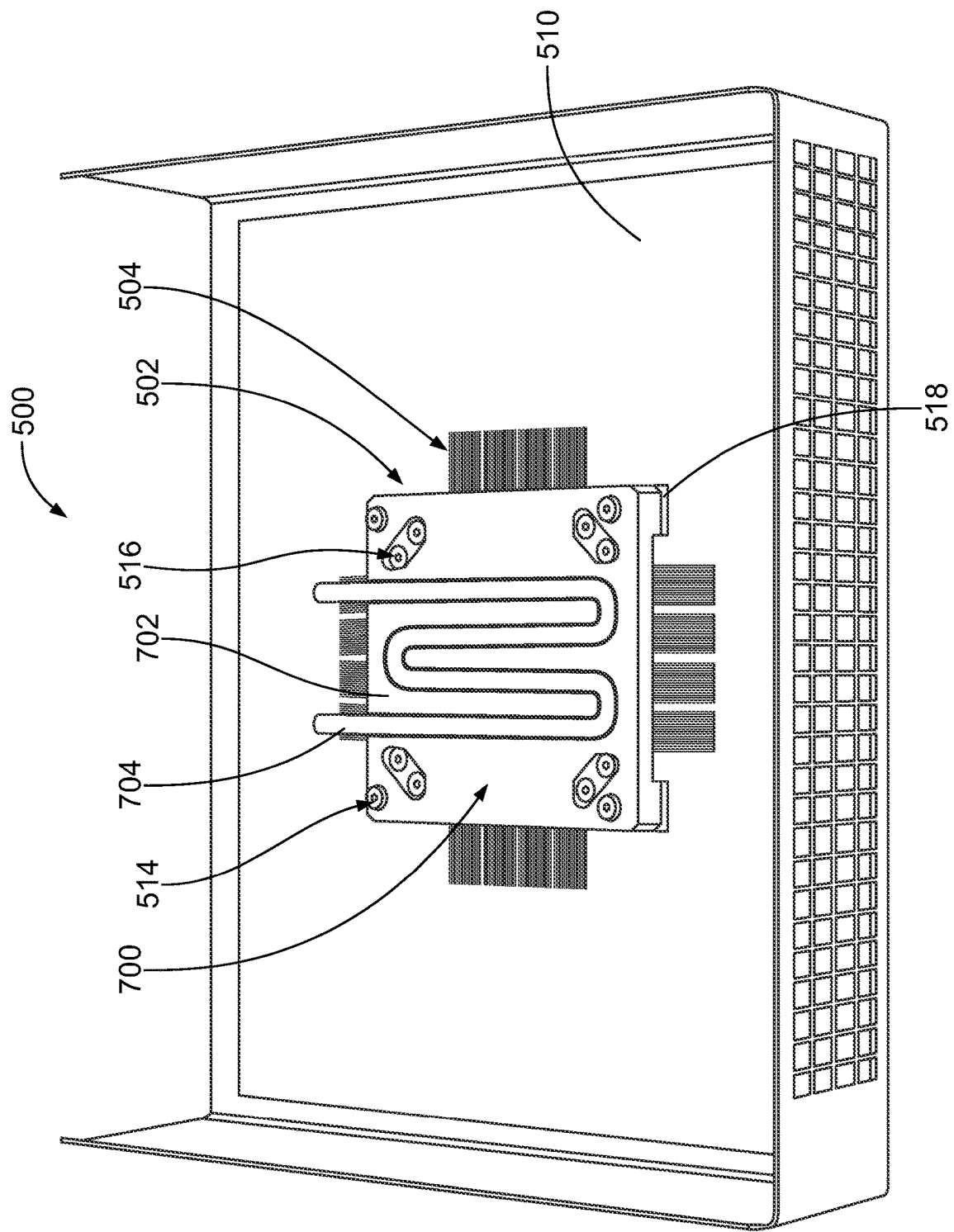
FIG. 18 is a top perspective view of a communication system having an electronic assembly in accordance with an exemplary embodiment.
Figure 19:
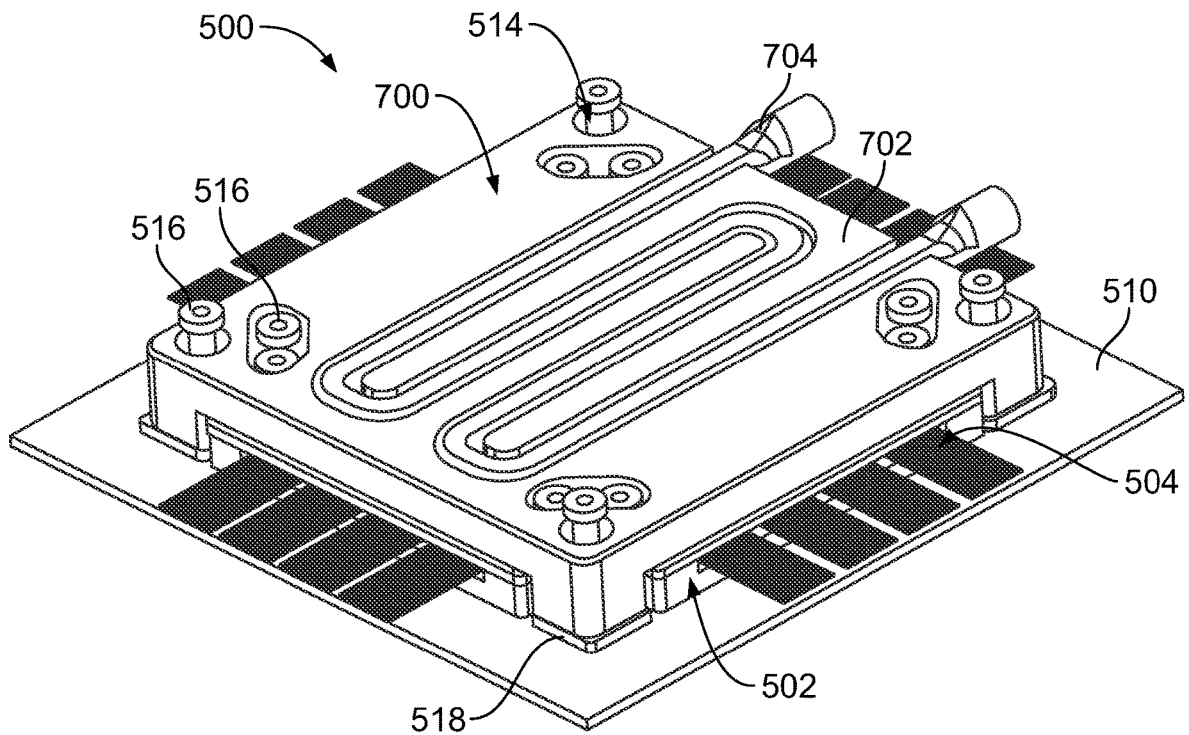
FIG. 19 is a perspective view of the communication system in accordance with an exemplary embodiment.
Figure 20:
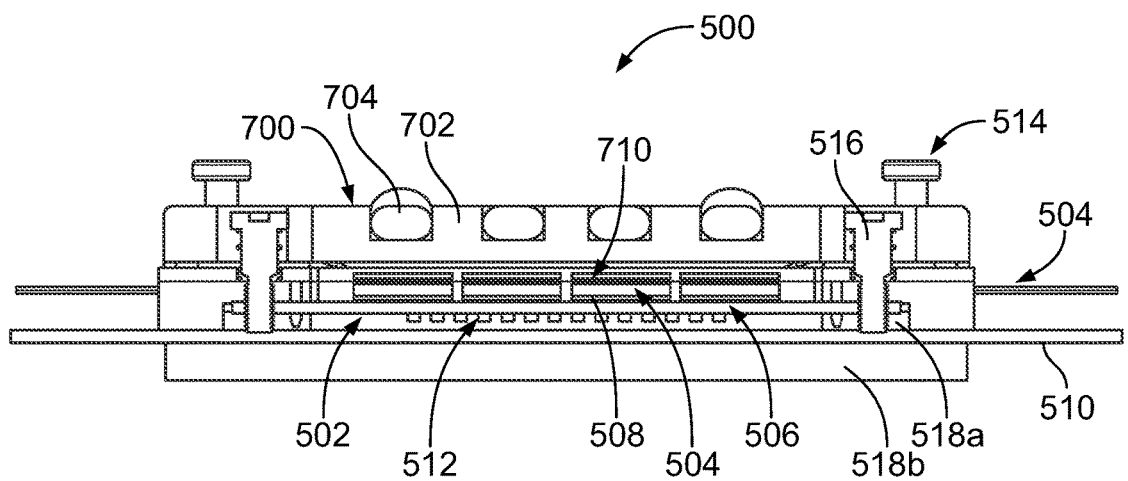
FIG. 20 is a cross-sectional view of the communication system in accordance with an exemplary embodiment.

FIG. 18 is a top perspective view of a communication system 500 having an electronic assembly 502 in accordance with an exemplary embodiment. FIG. 19 is a perspective view of the communication system 500 in accordance with an exemplary embodiment. FIG. 20 is a cross-sectional view of the communication system 500 in accordance with an exemplary embodiment. The communication system 500 may be used in a communication network, such as a network switch. For example, the electronic assembly 502 may be provided in a rack or tray of the network switch.

The electronic assembly 502 includes cable modules 504 electrically connected to an electronic package 506 (FIG. 20) by interposer assemblies 508 (FIG. 20). The electronic assembly 502 is electrically connected to a host circuit board 510 using a socket connector 512. In other various embodiments, the electronic assembly 502 is mounted directly to the host circuit board 510 without the use of the socket connector 512. In an exemplary embodiment, a compression assembly 514 is used to load the electronic assembly 502 to the socket connector 512 to electrically connect the electronic package 506 to the socket connector 512. For example, compression hardware 516, such as spring-loaded threaded fasteners, may be coupled to one or more bolster plates 518 (for example, a first bolster plate 518a above the host circuit board 510 and a second bolster plate 518b below the host circuit board 510) to couple the compression assembly 514 to the host circuit board 510 and the electronic assembly 502.

In an exemplary embodiment, the communication system 500 includes a heat transfer device 700 to dissipate heat from the electronic package 506 and/or the cable modules 504. In the illustrated embodiment, the heat transfer device 700 includes a cold plate 702 thermally coupled to the electronic assembly 502. A coolant line 704 may be thermally coupled to the cold plate 702 to dissipate heat from the cold plate 702. Other types of heat transfer devices 700 may be used in alternative embodiments, such as a heat sink. The heat sink may include fins or other heat dissipating elements extending therefrom to dissipate heat directly into the air or environment around the communication system 500. In an exemplary embodiment, the electronic assembly 502 includes thermal bridges 710 disposed between the heat transfer device 700 and the cable modules 504. The thermal bridges 710 thermally couple the heat transfer device 700 to the cable modules 504. In an exemplary embodiment, the thermal bridges 710 are compressible to form a compressible, separable interface between the heat transfer device 700 and the cable modules 504. The thermal bridges 710 may be formed by a plurality of interleaved, stacked plates. Other types of thermal bridges 710 may be used in alternative embodiments.

In various embodiments, the electronic package 506 is an integrated circuit assembly, such as an ASIC. However, the electronic package 506 may be another type of communication component. The cable modules 504 are electrically connected to the electronic package 506 via the interposer assemblies 508 independent of the host circuit board 510. For example, high-speed data signals are transmitted between the electronic package 506 and the cable modules 504 via the interposer assemblies 508 without the high-speed data signals passing through the host circuit board 510. In an exemplary embodiment, a plurality of cable modules 504 are coupled to the electronic package 506. For example, the cable modules 504 may be provided on multiple sides of the integrated circuit or other communication element of the electronic package 506. In the illustrated embodiment, the cable modules 504 are provided on all four sides of the integrated circuit. For example, cables from the cable modules 504 may extend in north, south, east and west directions. Other arrangements are possible in alternative embodiments where cable modules may be attached, for example, on one side, two sides (either opposite or adjacent to one another) or three sides of the integrated circuit. The cable modules 504 are clamped or compressed against the interposer assemblies 508 and are serviceable and removable from the electronic package 506.

Figure 21:
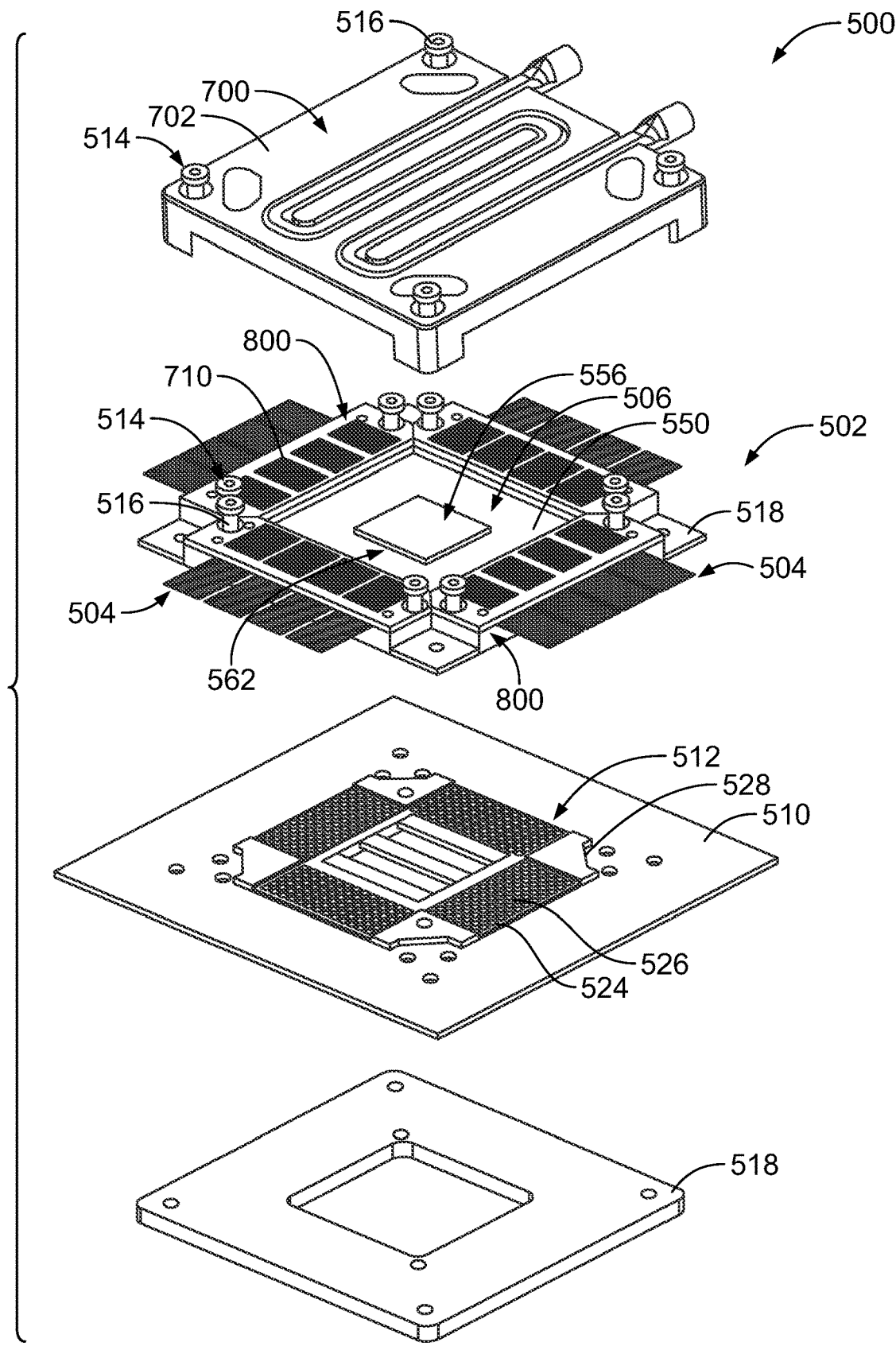
FIG. 21 is an exploded view of the communication system in accordance with an exemplary embodiment.
Figure 22:
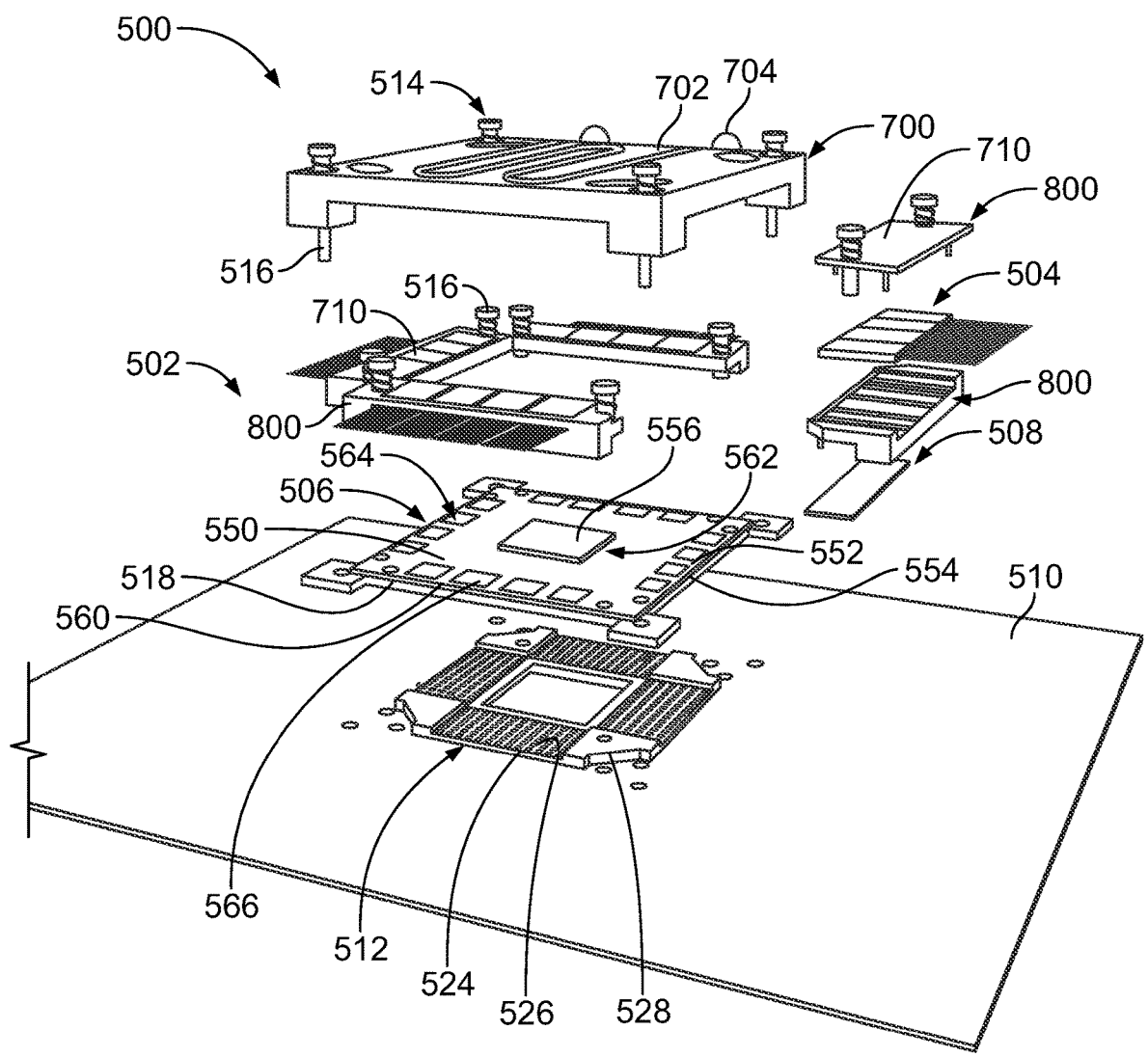
FIG. 22 is an exploded view of the communication system in accordance with an exemplary embodiment.

FIG. 21 is an exploded view of the communication system 500 in accordance with an exemplary embodiment. FIG. 22 is an exploded view of the communication system in accordance with an exemplary embodiment. FIGS. 21 and 22 illustrate the socket connector 512 mounted to the host circuit board 510 and the electronic assembly 502 poised for coupling to the socket connector 512. The heat transfer device 700 is poised for coupling to the electronic assembly 502 to dissipate heat from the electronic assembly 502. For example, the heat transfer device 700 may be used to dissipate heat from the cable modules 504 and/or the electronic package 506.

The socket connector 512 includes a socket substrate 524. The socket substrate 524 may be held by a socket frame. In various embodiments, the socket frame may be defined by one of the bolster plates 518, such as the bolster plate above the host circuit board 510. The bottom of the socket substrate 524 is configured to be mounted to the host circuit board 510 at a board interface. For example, the socket substrate 524 may be electrically connected to the host circuit board 510 by a ball grid array (BGA), a land grid array (LGA), or another mating interface. The socket connector 512 includes socket contacts 526, such as at the top of the socket substrate 524. In an exemplary embodiment, the socket contacts 526 are compressible contacts, such as spring beams, configured to be electrically connected to the electronic package 506. The compression assembly 514 may compress the socket contacts 526 when the compression assembly 514 is mounted to the host circuit board 510. In an exemplary embodiment, the socket connector 512 includes guide members 528 to guide mating of the electronic package 506 with the socket connector 512. For example, the guide members 528 may be edges, surfaces, posts, pins, pockets, openings or other types of guide members.

The compression assembly 514 is coupled to the top of the electronic assembly 502 to mechanically and electrically connect the electronic assembly 502 to the socket connector 512. The compression assembly 514 includes the compression hardware 516. The compression assembly 514 may include other components, such as a load plate actuated by the compression hardware 516 to compress the electrical assembly 502 against the socket connector 512. The cold plate 702 may define a load plate configured to be pressed downward against the electronic assembly 502 and the socket connector 512. The cold plate 702 transfers the compression load from the compression hardware 516 to the electronic assembly 502. A separate load plate may be provided in alternative embodiments. In an exemplary embodiment, the compression hardware 516 includes spring-loaded threaded fasteners configured to transfer spring forces to the load plate or directly to the electronic assembly 502. Other types of compression members may be used in alternative embodiments. When assembled, the electronic assembly 502 is pressed downward to force the electronic package 506 against the socket contacts 526. In an exemplary embodiment, the cold plate 702 may be compressed against the cable modules 504. The cold plate 702 may press the cable modules 504 into the interposer assemblies 508. The compressive forces from the cold plate 702 may be transferred to the socket contacts 526 through the compressive forces applied to the individual cable modules 504.

The electronic assembly 502 includes the electronic package 506 and a plurality of the cable modules 504 electrically connected to the electronic package 506. The interposer assemblies 508 (FIG. 22) electrically connect the cable modules 504 to the electronic package 506. The thermal bridges 710 are thermally coupled to the cable modules 504. In an exemplary embodiment, electronic assembly 502 includes carrier assemblies 800 used to couple the cable modules 504 to the electronic package 506. The carrier assemblies 800 compress the interposer assemblies 508 between the cable modules 504 and the electronic package 506. In an exemplary embodiment, each carrier assembly 800 holds a plurality of the cable modules 504, a plurality of the thermal bridges 710, and a plurality of the interposer assemblies 508. The carrier assembly 800 is used for mounting the plurality of the cable modules 504 to the electronic package 506 as a unit. The carrier assembly 800 positions the cable modules 504 and the interposer assemblies 508 relative to each other for guided mating with the electronic package 506. The carrier assemblies 800 may be separately mated to and removed from the electronic package 506, such as for repair or replacement without needing to disassemble the entire electronic assembly 502.

In an exemplary embodiment, the interposer assemblies 508 define separable mating interfaces. For example, each interposer assembly 508 includes an upper separable mating interface, such as a compressible interface. As such, the cable modules 504 may be removable or replaceable. For example, during a testing process, each cable module 504 may be individually tested and adjusted or replaced to ensure that the electronic assembly 502 is functional prior to assembly with the socket connector 512. Each interposer assembly 508 may include a lower separable mating interface, such as a compressible interface. The contacts of the interposer assembly 508 may be compressible columnar contacts, such as conductive elastomeric contacts. In other embodiments, the contacts of the interposer assembly 508 may be stamped and formed contacts, such as including spring beams. The spring beams may be provided at the top and/or the bottom of the interposer assembly 508. The contacts may be press fit contacts, solder contacts, or other types of contacts in alternative embodiments. In various embodiments, a plurality of interposer assemblies 508 are mounted to the carrier assembly 800 and coupled to the corresponding cable modules 504. In alternative embodiments, a single interposer assembly 508 may be provided in the carrier assembly 800 for mating with the plurality of cable modules 504.

The electronic package 506 includes a package substrate 550 having an upper surface 552 and a lower surface 554. The electronic package 506 includes an integrated circuit component 556 mounted to the upper surface 552 of the package substrate 550. The integrated circuit component 556 may be a chip, an ASIC, a processor, a memory module or another component mounted to the top of the package substrate 550. In the illustrated embodiment, the integrated circuit component 556 is rectangular and approximately centered on the package substrate 550; however, the integrated circuit component 556 may have other shapes or locations in alternative embodiments. In an exemplary embodiment, the package substrate 550 includes locating features 558 (shown in FIG. 23) for locating the electronic package 506 relative to the socket connector 512. In the illustrated embodiment, the locating features 558 are openings through the package substrate 550 that receive fasteners, such as the compression hardware 516. Other types of locating features may be used in alternative embodiments, such as channels, dimples, extensions, tabs, posts, pins, and the like.

The package substrate 550 includes edges 560 extending around the perimeter of the package substrate 550. In the illustrated embodiment, the package substrate 550 is rectangular shape having four perpendicular edges. The package substrate 550 may have other shapes including greater or fewer edges 560 in alternative embodiments. The integrated circuit component 556 is mounted to the package substrate 550 at a component mounting area 562, which may be approximately centered between the edges 560. The package substrate 550 includes package contacts (not shown) at the component mounting area 562 used to electrically connect the integrated circuit component 556 to the package substrate 550. The package contacts may be pads, traces, vias, and the like.

The package substrate 550 includes lower package contacts (not shown) at the lower surface 554 of the package substrate 550. The lower package contacts are used to electrically connect the electronic package 506 to the socket connector 512. For example, the lower package contacts are electrically connected to corresponding socket contacts 526. In an exemplary embodiment, power and low-speed data signals are transmitted through the lower package contacts between the package substrate 550 and the socket connector 512. High speed data signals may additionally be transmitted through the lower package contacts. The lower package contacts are electrically connected to the integrated circuit component 556 via corresponding package contacts. In an exemplary embodiment, the lower package contacts may be approximately centered along the lower surface 554, such as directly below the component mounting area 562.

The package substrate 550 includes upper package contacts 566 (shown in FIG. 24) at the upper surface 552 of the package substrate 550. The upper package contacts are used to electrically connect the electronic package 506 to the cable modules 504 via the interposer assemblies 508. In an exemplary embodiment, high-speed data signals are transmitted through the upper package contacts 566 between the package substrate 550 and the cable modules 504. The upper package contacts 566 are electrically connected to the integrated circuit component 556 via corresponding package contacts. In an exemplary embodiment, the upper package contacts 566 are provided around the outer periphery of the package substrate 550. In an exemplary embodiment, the package substrate 550 includes mounting areas 564 around the outer periphery of the package substrate 550. The interposer assemblies 508 and the cable modules 504 are coupled to the package substrate 550 at the mounting areas 564. The mounting areas 564 are located between the integrated circuit component 556 at the component mounting area 562 and the edges 560. In the illustrated embodiment, the mounting areas 564 are provided along all four sides of the integrated circuit component 556 for the purpose of achieving short electrical traces (improved signal integrity) to/from the integrated circuit component 556.

The electronic assembly 502 has high channel density for data communication and power distribution to the integrated circuit component 556. For example, data channels are provided on both the upper surface 552 and the lower surface 554 of the package substrate 550. A subset of the data signals, such as the low speed and/or sideband data signals, are routed through the bottom of the electronic package 506 to the host circuit board 510 and a subset of the data signals, such as the high speed data signals, are routed through the top of the electronic package 506 to the cable modules 504. The performance and design efficiency are enhanced by increasing the number of data channels to the integrated circuit component 556. Furthermore, by routing the high-speed data signals directly to the cable modules 504, rather than routing the high-speed data signals through the host circuit board 510, the performance of the communication system 500 is enhanced. In an exemplary embodiment, the cable modules 504 are coupled to the electronic package 506 at multiple locations (e.g., at four sides of the chip) to increase density of the communication system 500 and shorten electrical paths of the communication system 500. The arrangement reduces the number of interfaces needed along the bottom of the package substrate 550 by routing the data channels to the top of the package substrate 550 for take-off by the cable modules 504. In various embodiments, the cable modules 504 may be optical modules having an optical engine for digital-to-optical conversion. In alternative embodiments, the cable modules 504 may be electrical modules having electrical conductors, such as copper conductors. The cable modules 504 are separable from the electronic package 506 using the interposer assemblies 508. Each cable module 504 has its own compressive mating force using the corresponding carrier assembly 800. The carrier assemblies 800 can be removed to service the cable module 504, such as to adjust or replace the cable modules 504 after testing.

Figure 23:
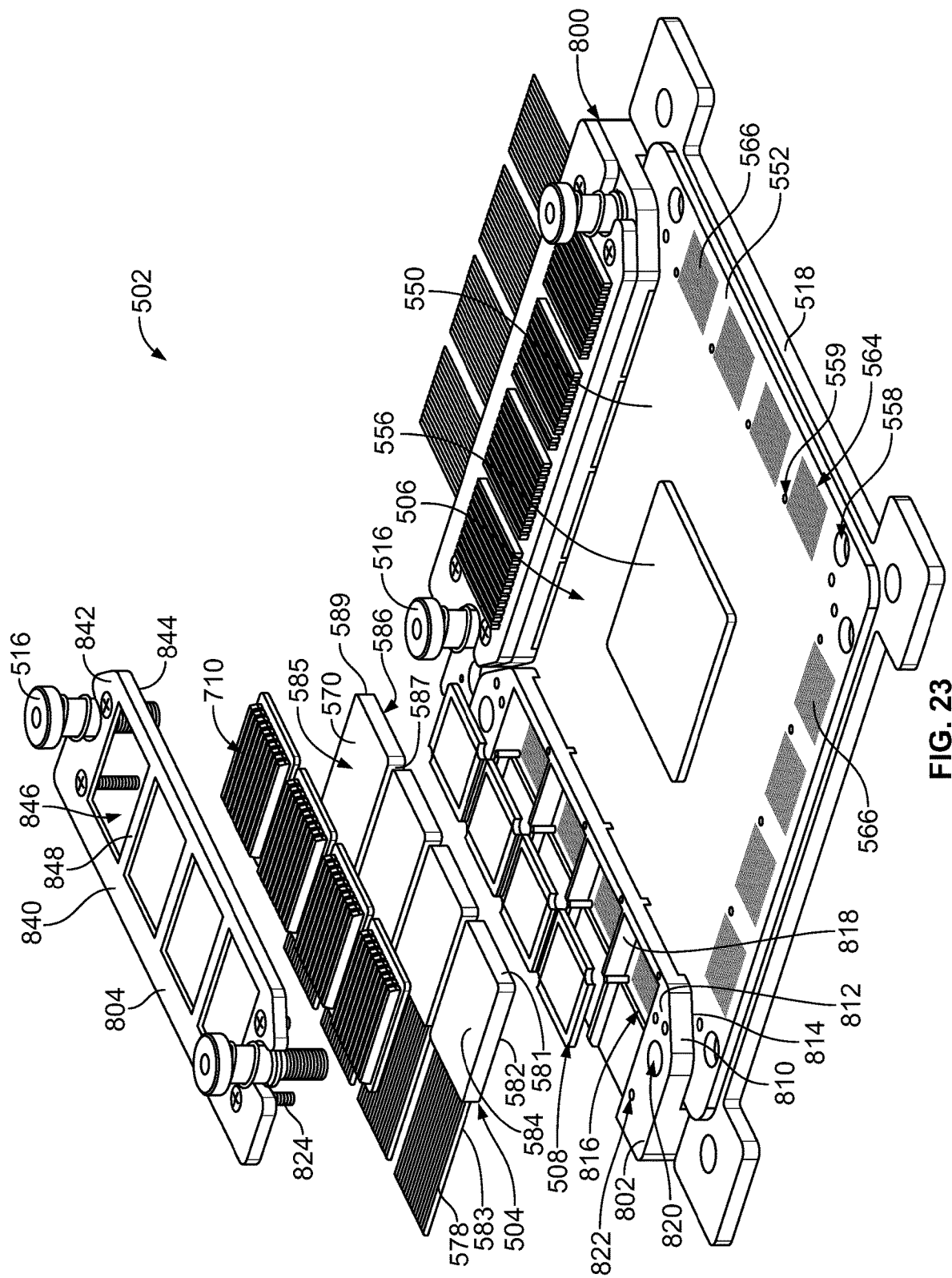
FIG. 23 is an exploded view of the electronic assembly in accordance with an exemplary embodiment.

FIG. 23 is an exploded view of the electronic assembly 502 in accordance with an exemplary embodiment. FIG. 23 illustrates one of the carrier assemblies 800 mounted to the electronic package 506 and another carrier assembly 800 in an exploded state to illustrate the cable modules 504, interposer assemblies 508 and thermal bridges 710. The package substrate 550 is shown mounted to the bolster plate 518. The bolster plate 518 provides structural support for the package substrate 550, such as to prevent warpage of the package substrate 550. The bolster plate 518 may define a frame for the socket connector 512 (shown in FIG. 21). For example, the bolster plate 518 may include an opening or pocket that receives the socket connector 512 to position the package substrate 550 relative to the socket connector 512.

Figure 25:
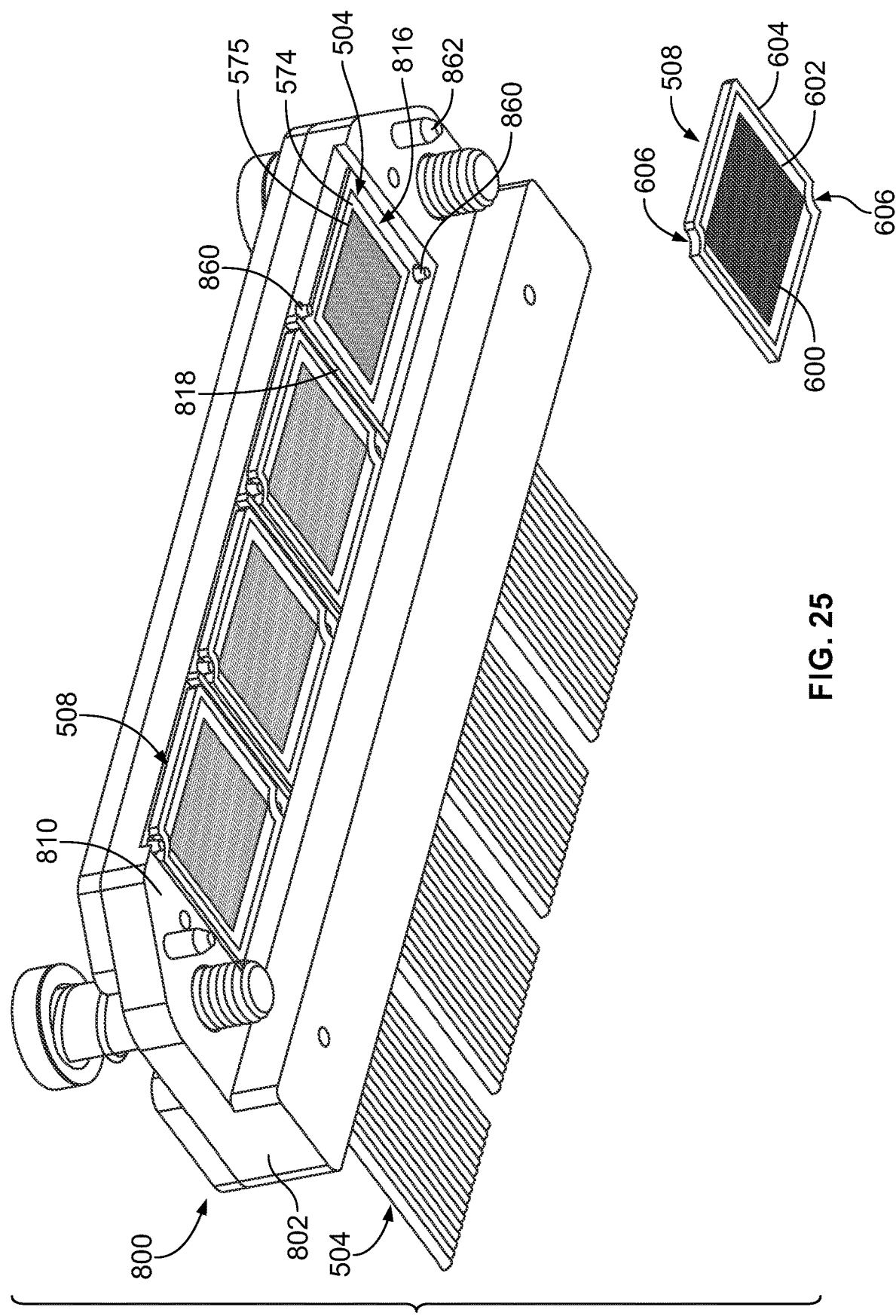
FIG. 25 is a bottom perspective view of the carrier assembly in accordance with an exemplary embodiment.

The cable module 504 includes a cable module housing 570 having a cavity that receives a cable module substrate 574 (shown in FIG. 25). In various embodiments, the cable module 504 may be an optical module with an optical engine within the housing 570 for processing data signals. In an exemplary embodiment, the optical engine includes an electrical-to-optical converter configured to convert between electrical signals and optical signals. The optical engine may include other electrical components.

The cable module housing 570 extends between a front 581 and a rear 583 of the cable module 504. The cable module housing 570 extends between sides 587, 589 of the cable module 504. The cable module substrate 574 (shown in FIG. 25) is provided at a bottom 582 of the cable module 504. The cable module 504 includes one or more cables 578 extending from the rear 583 of the cable module housing 570. The cables 578 may be fiber optic cables in various embodiments. In other various embodiments, the cables 578 may be electrical cables, such as including copper conductors. The electrical cables may be coaxial cables or twin axial cables in various embodiments. The cables 578 may be coupled to the cable module substrate 574 (or the optical engine when provided).

The thermal bridges 710 are configured to engage the cable module housing 570 to dissipate heat from the cable module 504. For example, the thermal bridges 710 may be coupled to a top 584 of the cable module housing 570. Each thermal bridge 710 includes thermal interfaces 585, 586 for interfacing with the heat transfer device 700 (shown in FIG. 1) and the cable module 504, respectively. The thermal bridge 710 may be a molded or die cast component, such as manufactured from metal or a thermally conductive polymer material. Optionally, the thermal interfaces 585, 586 may be compressible and/or deformable for engaging the heat transfer device 700 and/or the cable module 504. In other various embodiments, the thermal bridge 710 may include plates, such as interleaved plates that are movable relative to each other to make the thermal bridge compressible and/or conformable to the heat transfer device 700 and/or the cable module 504. In alternative embodiments, the thermal bridge 710 may include a block or base and heat transfer fins or other heat dissipating elements extending from the base.

The carrier assembly 800 includes a carrier base block 802 and a carrier lid 804 configured to be coupled to the carrier base block 802. The cable modules 504, the interposer assemblies 508 and the thermal bridges 710 are configured to be sandwiched between the carrier base block 802 and the carrier lid 804. The compression hardware 516 is used to secure the carrier lid 804 and the carrier base block 802 to the electronic package 506 and/or the bolster plate 518. The carrier assembly 800 may be biased or pressed downward by the compression hardware 516 to press the thermal bridges 710 into thermal contact with the cable modules 504 and to press the cable modules 504 into the interposer assemblies 508.

The carrier base block 802 includes a platform 810 having an upper surface 812 and a lower surface 814. The platform 810 holds the cable modules 504, the interposer assemblies 508 and the thermal bridges 710. The platform 810 is configured to be coupled to the upper surface 552 of the package substrate 550. The platform 810 includes interposer assembly openings 816 therethrough. The interposer assembly openings 816 are separated by base block locating rails 818. The base block locating rails 818 define pockets that receive the cable modules 504, interposer assemblies 508 and thermal bridges 710. The base block locating rails 818 are used to guide or locate the cable modules 504, interposer assemblies 508 and thermal bridges 710 relative to each other and relative to the interposer assembly openings 816. The carrier base block 802 includes openings 820 that receive the compression hardware 516. The carrier base block 802 includes fastener openings 822 that receive fasteners 824. The fasteners 824 are used to secure the carrier lid 804 to the carrier base block 802.

The carrier lid 804 includes a plate 840 having an upper surface 842 and a lower surface 844. The lower surface 844 is configured to be coupled to the upper surface 812 of the carrier base block 802. The carrier lid 804 includes carrier lid openings 846 aligned with the interposer assembly openings 816. The carrier lid openings 846 are formed by lid locating rails 848. The carrier lid openings 846 receive the thermal bridges 710. The thermal bridges 710 extend through the carrier lid openings 846 such that the upper thermal interfaces 585 are positioned above the upper surface 842 for interfacing with the heat transfer device 700. The lid locating rails 848 are used for locating the thermal bridges 710 relative to each other for interfacing with the cable modules 504.

During assembly, the interposer assemblies 508 are located in the interposer assembly openings 816, such as between the base block locating rails 818. The cable assemblies 504 are received in the openings 816 between the base block locating rails 818 above the corresponding interposer assemblies 508. The thermal bridges 710 are located above the cable assemblies 504. Once the interposer assemblies 508, the cable modules 504, and the thermal bridges 710 are stacked up in the carrier base block 802, the carrier lid 804 is placed over the thermal bridges 710 and coupled to the carrier base block 802. The cable modules 504, interposer assemblies 508 and thermal bridges 710 are sandwiched between the carrier lid 804 and the carrier base block 802. The carrier lid 804 holds the cable modules 504, interposer assemblies 508 and thermal bridges 710 in the carrier assembly 800. The carrier assembly 800 groups together the plurality of cable assemblies 504 for handling and mating with the electronic package 506. The carrier assembly 800 is used to couple the plurality of cable modules 504, interposer assemblies 508 and thermal bridges 710 to the electronic package 504 as a unit. The carrier assembly 800 holds the relative positions of interposer assemblies 508 for aligning the interposer assemblies 508 with the upper package contacts 566 of the electronic package 506.

Figure 24:
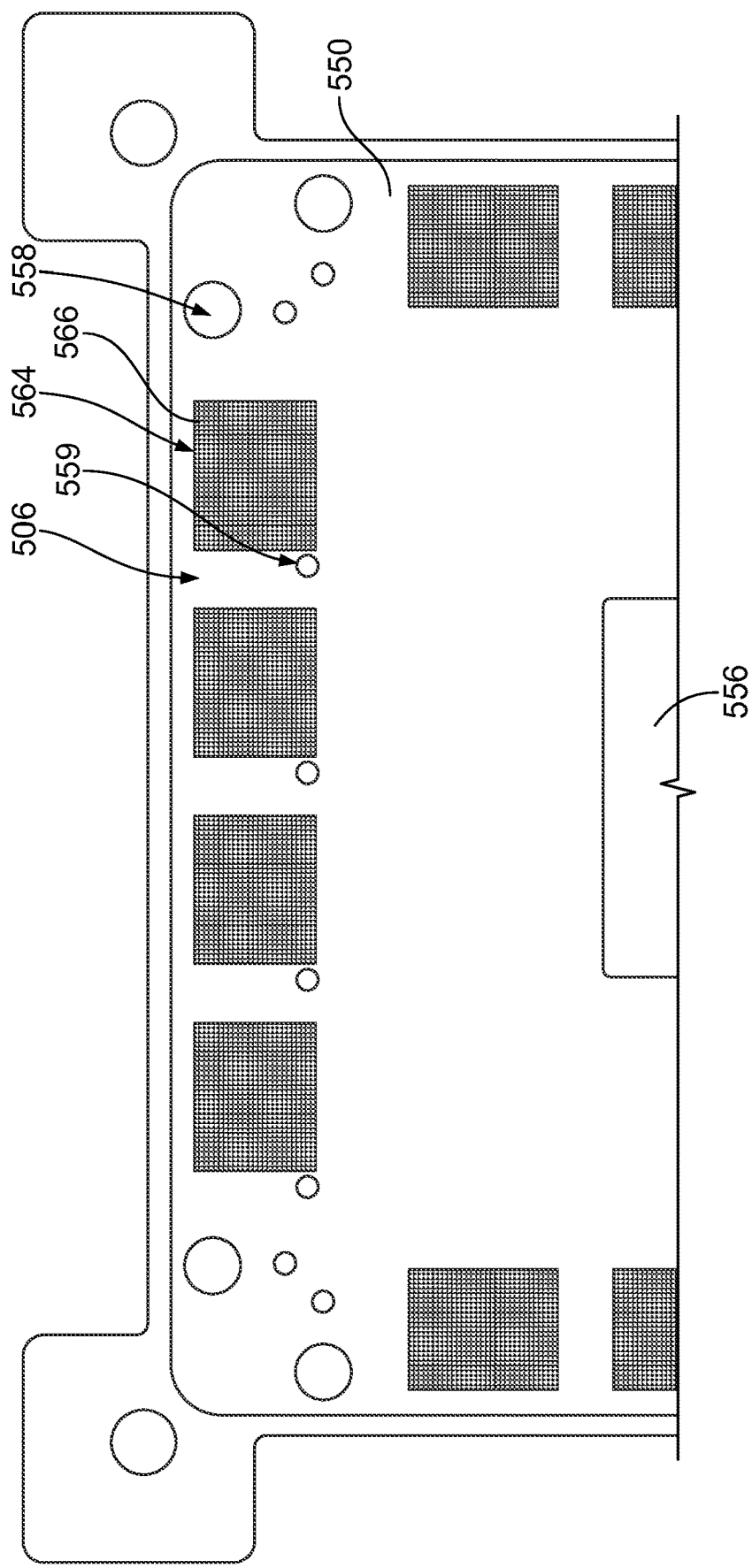
FIG. 24 is a top view of a portion of the electronic package in accordance with an exemplary embodiment.

With additional reference to FIG. 24, which is a top view of a portion of the electronic package 506, the electronic package 506 includes the upper package contacts 566 are provided in various package mounting areas 564. The upper package contacts 566 are electrically connected to the integrated circuit component 556 via corresponding package contacts (for example, traces). In an exemplary embodiment, the upper package contacts 566 are provided around the outer periphery of the package substrate 550. The interposer assemblies 508 and the cable modules 504 are coupled to the package substrate 550 at the mounting areas 564. In the illustrated embodiment, the mounting areas 564 are provided along all four sides of the integrated circuit component 556 for the purpose of achieving short electrical traces (improved signal integrity) to/from the integrated circuit component 556. In various embodiments, the upper package contacts 566 are contact pads. In other various embodiments, the upper package contacts 566 may be compressible contacts, such as spring contacts. The interposer assemblies 508 are compressed against the upper package contacts 566 by the compression hardware 516 (FIG. 23).

In an exemplary embodiment, the package substrate 550 includes the locating features 558 for locating the carrier assemblies 800 relative to the electronic package 506. The locating features 558 are openings through the package substrate 550 that receive fasteners, such as the compression hardware 516. In the illustrated embodiment, the locating features 558 are provided near the edges or the corners, such as flanking both sides of the mounting areas 564. Other types of locating features may be used in alternative embodiments. In an exemplary embodiment, the package substrate includes interposer locating features 559 for locating the interposer assemblies 508 relative to the electronic package 506. The interposer locating features 559 are openings in the package substrate 550 that receive locating features of the carrier assemblies 800 and/or the interposer assemblies 508 for locating the interposer assemblies 508 relative to the mounting areas 564 and the upper package contacts 566. The locating features 559 are provided near the mounting areas 564. Other types of interposer locating features 559 may be used in alternative embodiments.

FIG. 25 is a bottom perspective view of the carrier assembly 800 in accordance with an exemplary embodiment. FIG. 25 illustrates one of the interposer assemblies 508 removed from the carrier assembly 800 to illustrate a portion of the cable module 504. The cable module 504 includes the cable module substrate 574. The cable module substrate 574 may be a printed circuit board or other suitable material for routing electrical traces. The cable module substrate 574 includes module contacts 575 configured to be electrically connected to the interposer assembly 508. For example, the module contacts 575 may be pads on the bottom of the cable module substrate 574.

The interposer assemblies 508 are coupled to the bottom of the platform 810, such as in the interposer assembly openings 816. The rails 818 locate the interposer assemblies 508 relative to each other. Each interposer assembly 508 includes an array of interposer contacts 600 held together by a support plate 602. The interposer assembly 508 includes an interposer frame 604 holding the support plate 602 and the interposer contacts 600.

In an exemplary embodiment, the support plate 602 is a film having an upper surface and a lower surface. The support plate 602 may include openings therethrough holding corresponding interposer contacts 600. The support plate 602 is manufactured from an insulative material, such as a polyimide material, to electrically isolate the interposer contacts 600 from one another. In an exemplary embodiment, the interposer contacts 600 are compressible contacts, such as conductive polymer columns. Each interposer contact 600 includes an upper mating interface and a lower mating interface. The upper mating interface is located above the upper surface of the support plate 602 and the lower mating interface is located below the lower surface of the support plate 602. The interposer contacts 600 are compressible between the upper mating interfaces and the lower mating interfaces. Optionally, the upper and lower mating interfaces may be planar interfaces oriented parallel to each other. Optionally, sides of the interposer contacts 600 may be tapered. For example, the sides may be oriented nonparallel to the upper and lower mating interfaces. The upper and lower portions of the interposer contacts 600 may be cone-shaped, such as being frusto-conical. Other types of interposer contacts 600 may be utilized in alternative embodiments.

In an exemplary embodiment, the interposer frame 604 includes interposer locating features 606. The interposer locating features 606 may be pockets or openings formed in the interposer frame 604. The interposer locating features 606 are configured to engage carrier locating features 860 of the carrier assembly 800. For example, the carrier locating features 860 may be pins or posts extending from the carrier base block 802. The carrier locating features 860 are configured to be coupled to the interposer locating features 559 of the electronic package 506 to locate the carrier assembly 800 and the interposer assemblies 508 relative to the package substrate 550. Optionally, some of the carrier locating features 860 may be longer and extend beyond the bottom and/or the interposer assemblies 508 to plug into the package substrate 550 and some of the carrier locating features 860 may be shorter, such as being flush with the bottom of the interposer assemblies 508 or recessed relative to the interposer assemblies 508.

In an exemplary embodiment, the carrier assembly 800 includes carrier locating features 862. The carrier locating features 862 extend from the bottom of the platform 810. For example, the carrier locating features 860 may be pins or posts extending from the carrier base block 802. The carrier locating features 860 are configured to be coupled to the interposer locating features 559 of the electronic package 506 to locate the carrier assembly 800 and the interposer assemblies 508 relative to the package substrate 550.

Figure 26:
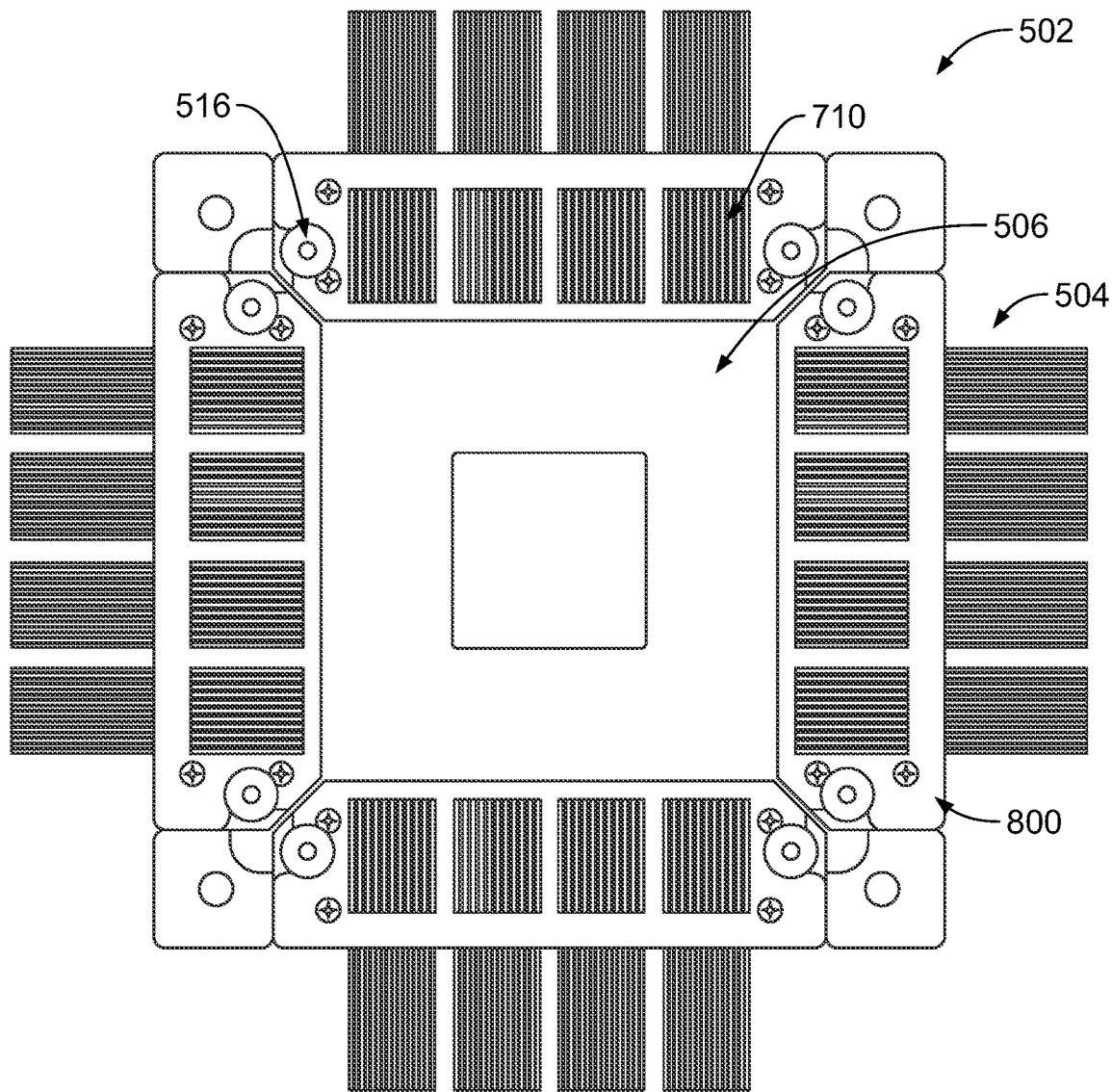
FIG. 26 is a top view of the electronic assembly in accordance with an exemplary embodiment.
Figure 27:
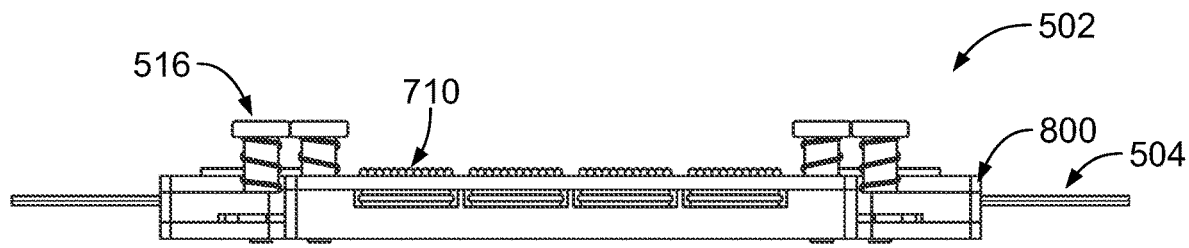
FIG. 27 is a side view of the electronic assembly in accordance with an exemplary embodiment.

FIG. 26 is a top view of the electronic assembly 502 in accordance with an exemplary embodiment. FIG. 27 is a side view of the electronic assembly 502 in accordance with an exemplary embodiment. The carrier assemblies 800 hold the cable modules 504 and interposer assemblies 508 for electrical connection with the electronic package 506. The thermal bridges 710 are exposed at the top for interfacing with the heat transfer device 700 (shown in FIG. 1). The carrier assemblies 800 compress the cable modules 504 and interposer assemblies 508 against the electronic package 506 at the compressible, separable interface. For example, the compression hardware 516 is used to press the carrier assemblies 800 downward, which compresses the cable modules 504 and interposer assemblies 508.

Figure 28:
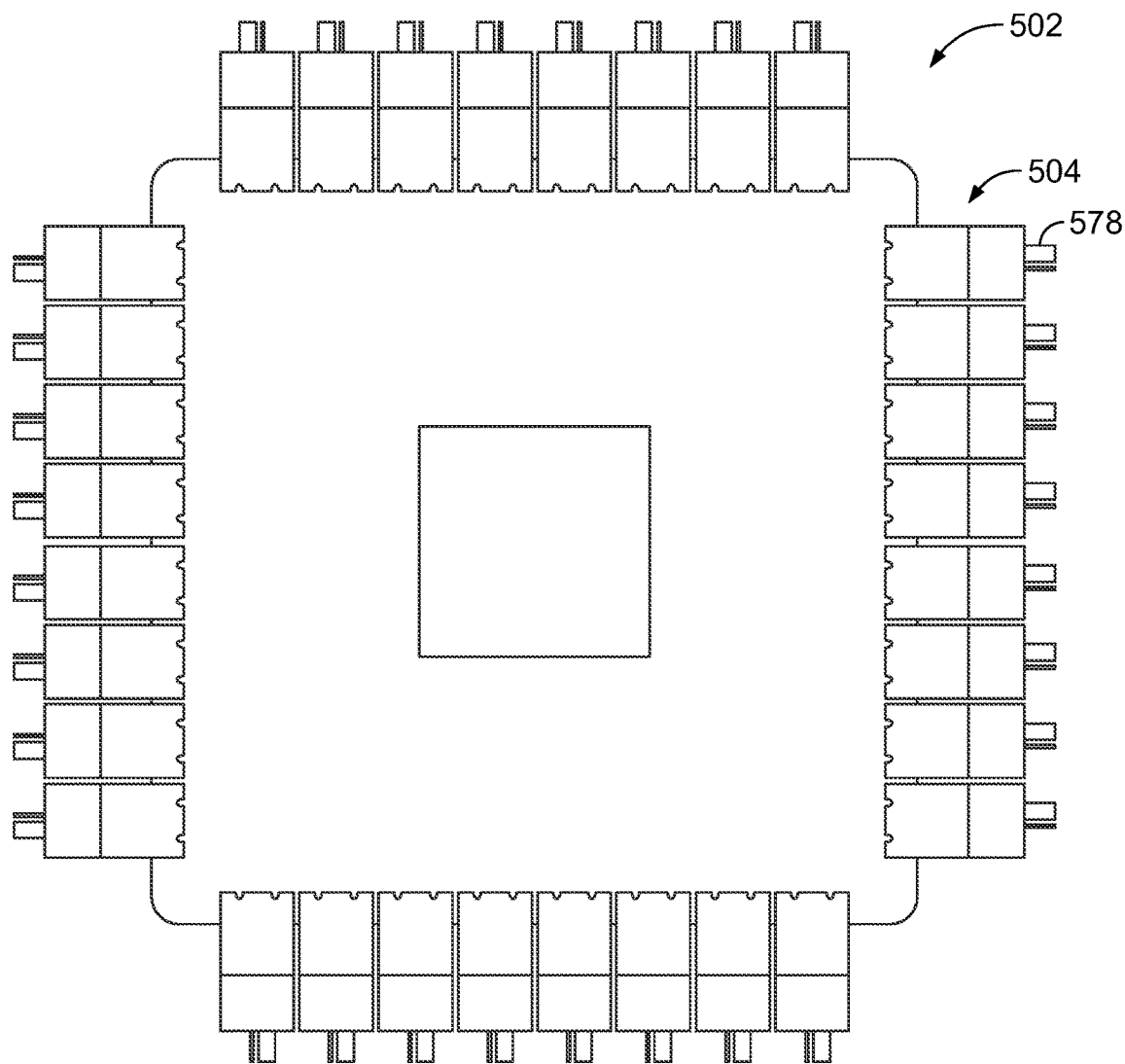
FIG. 28 is a top view of a portion of the electronic assembly in accordance with an exemplary embodiment.
Figure 29:
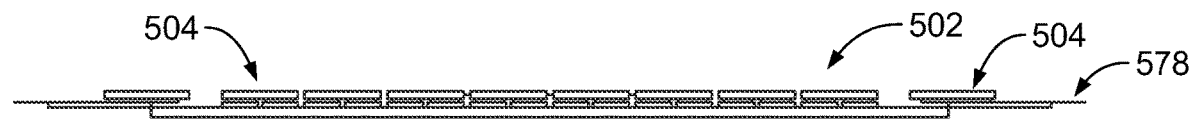
FIG. 29 is a side view of a portion of electronic assembly in accordance with an exemplary embodiment.

FIG. 28 is a top view of a portion of the electronic assembly 502 in accordance with an exemplary embodiment. FIG. 29 is a side view of a portion of electronic assembly 502 in accordance with an exemplary embodiment. FIGS. 28 and 29 illustrate the cable modules 504 as optic modules. In the illustrated embodiment, each side of the electronic assembly 502 includes eight cable modules 504; however, greater or fewer cable modules 504 may be provided in alternative embodiments. The cable modules 504 are illustrated without the carrier assemblies 800 (shown in FIGS. 26-27). The cables 578 are fiber optic cables. The cable modules 504 include optical engines for converting between optical and electrical signals.

Figure 30:
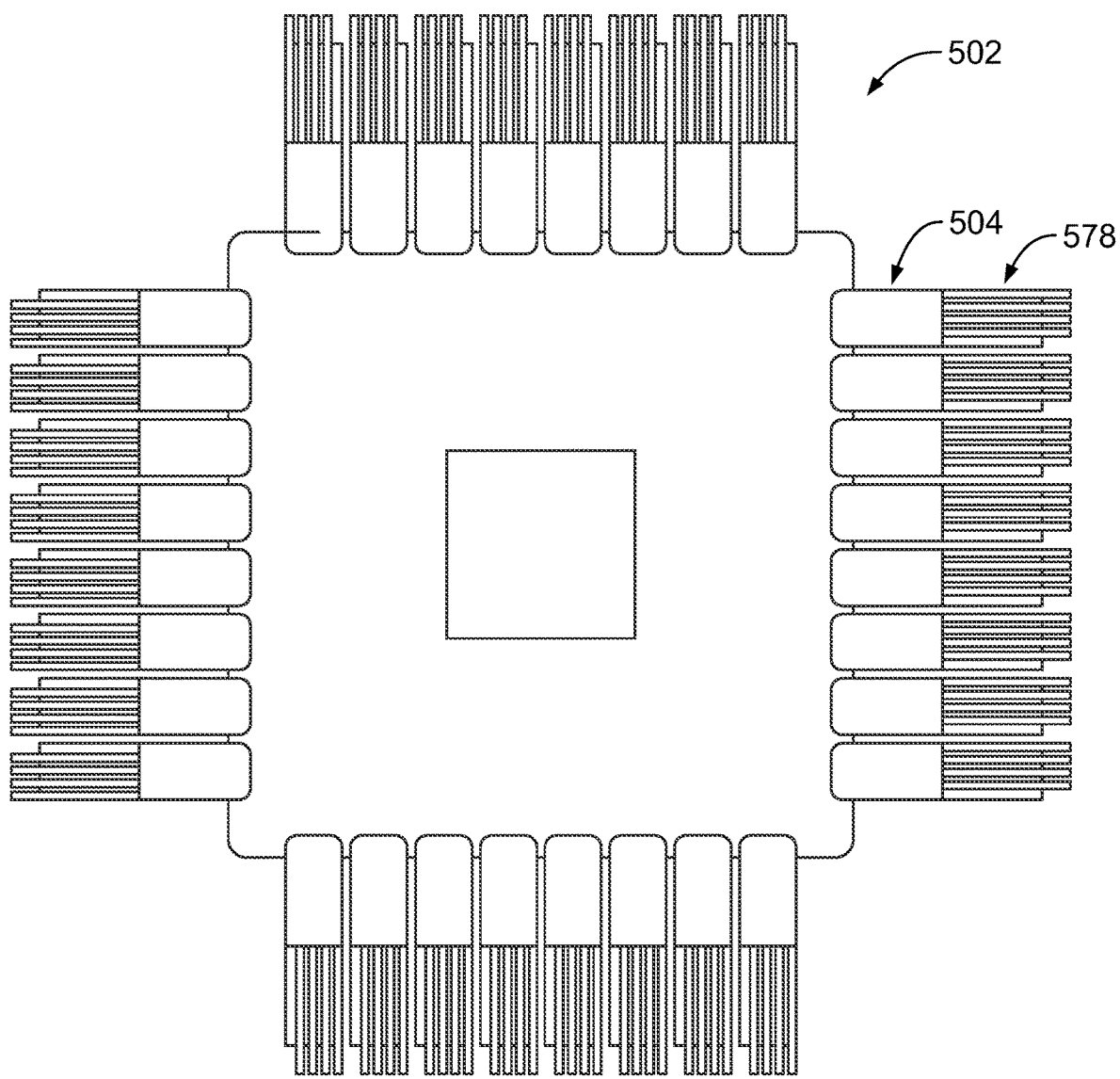
FIG. 30 is a top view of a portion of the electronic assembly in accordance with an exemplary embodiment.
Figure 31:
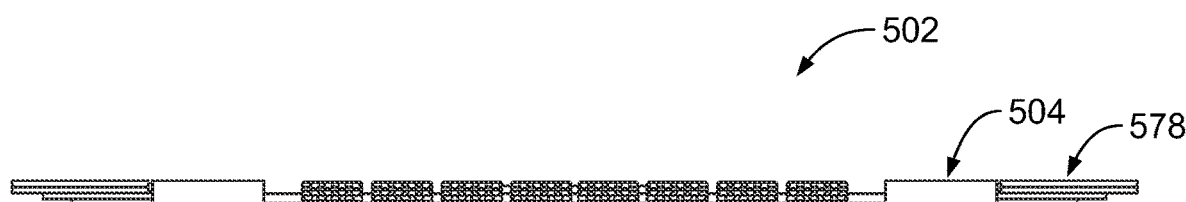
FIG. 31 is a side view of a portion of electronic assembly in accordance with an exemplary embodiment.

FIG. 30 is a top view of a portion of the electronic assembly 502 in accordance with an exemplary embodiment. FIG. 31 is a side view of a portion of electronic assembly 502 in accordance with an exemplary embodiment. FIGS. 30 and 31 illustrate the cable modules 504 as electrical modules. In the illustrated embodiment, each side of the electronic assembly 502 includes eight cable modules 504; however, greater or fewer cable modules 504 may be provided in alternative embodiments. The cable modules 504 are illustrated without the carrier assemblies 800 (shown in FIGS. 26-27). The cables 578 are electrical cables, such as coaxial cables, twin axial cables, ribbon cables, and the like.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. An electronic assembly comprising:
an electronic package including a package substrate having an upper surface and a lower surface, the electronic package including an integrated circuit component mounted to the upper surface of the package substrate, the electronic package includes lower package contacts electrically connected to the integrated circuit component and configured to be electrically connected to a host circuit board, the electronic package includes upper package contacts electrically connected to the integrated circuit component;
interposer assemblies electrically connected to the electronic package, each interposer assembly including an array of interposer contacts, the interposer contacts being compressible, each interposer contact having an upper mating interface and a lower mating interface, the lower mating interfaces of the interposer contacts are mated with the upper package contacts, the interposer assemblies defining separable interfaces with the electronic package;
cable modules coupled to the upper separable interface of the interposer assemblies, each cable module including a cable module substrate having module contacts and cables terminated to the cable module substrate being electrically connected to the module contacts; and
carrier assemblies configured to be coupled to the upper surface of the electronic package, each carrier assembly including a carrier base block and a carrier lid, each carrier assembly configured to hold at least one interposer assembly and at least one cable module between the carrier base block and the carrier lid, the carrier assemblies holding the cable modules with the module contacts in electrical connection with the upper mating interfaces of the interposer contacts, the carrier assemblies holding the lower mating interfaces of the interposer contacts in electrical connection with the upper package contacts of the electronic package, the carrier assemblies being separately removable from the electronic package to separate the interposer assemblies from the electronic package.

2. The electronic assembly of claim 1, wherein the interposer assemblies and the cable modules are sandwiched between the carrier base blocks and the carrier lids.

3. The electronic assembly of claim 1, wherein the carrier base blocks include interposer assembly openings holding the interposer assemblies at fixed locations for mating with the electronic package, and the carrier base including locating features for positioning the cable modules at fixed locations for mating with the interposer assemblies.

4. The electronic assembly of claim 1, further comprising thermal bridges thermally coupled to the cable modules, the carrier assemblies holding the thermal bridges in thermal communication with the cable modules, the carrier lid including carrier lid openings receiving the thermal bridges, the thermal bridges passing through the carrier lid to thermally interface with the cable modules and a heat transfer device.

5. The electronic assembly of claim 1, wherein each carrier assembly holds a plurality of the interposer assemblies and a plurality of the cable modules.

6. The electronic assembly of claim 1, wherein the carrier assembly further comprises compression hardware coupled to the electronic package, the compression hardware configured to compress the interposer contacts against the upper package contacts of the electronic package.

7. The electronic assembly of claim 1, wherein the carrier base block includes a carrier guide pin extending from a bottom of the carrier base block to position the carrier base block relative to the package substrate.

8. The electronic assembly of claim 1, wherein the carrier base blocks include interposer guide pins engaging the interposer assemblies to locate the interposer assemblies relative to the carrier base blocks, the interposer guide pins extending from a bottom of the carrier base block to engage the package substrate and position the carrier base blocks relative to the package substrate.

9. The electronic assembly of claim 1, wherein the interposer contacts comprise conductive polymer columns held in the array by a support plate, the upper mating interfaces being located above the support plate, the lower mating interfaces being located below the support plate.

10. The electronic assembly of claim 1, wherein the upper mating interfaces are compressible and the lower mating interfaces are compressible.

11. The electronic assembly of claim 1, wherein the interposer assembly includes an interposer frame holding a support plate, the support plate holding each of the interposer contacts in the array, the interposer frame including lower locating pins engaging the package substrate to locate the interposer assembly relative to the upper package contacts, the interposer frame including upper locating pins engaging the cable module to locate the cable module relative to the interposer contacts.

12. The electronic assembly of claim 1, wherein the cable module includes a cable module housing holding the cable module substrate and an optical engine coupled to the cable module substrate, the cable module housing being captured between the corresponding carrier base block and the carrier lid.

13. The electronic assembly of claim 1, wherein the package substrate includes edges around the perimeter of the package substrate, the package substrate including mounting areas between the integrated circuit and the edges, each mating area receiving one of the carrier assemblies, each of the carrier assemblies including a plurality of the cable modules and a plurality of the interposer assemblies.

14. A carrier assembly for an electronic package of a communication system, the carrier assembly comprising:
  a carrier base block having a platform having an upper surface and a lower surface, the platform configured to be coupled to an upper surface of the electronic package, the platform including interposer assembly openings therethrough, the interposer assembly openings formed by base block locating rails;
  a carrier lid coupled to the upper surface of the carrier base block, the carrier lid including carrier lid openings aligned with the interposer assembly openings, the carrier lid openings formed by lid locating rails;
  interposer assemblies received in the interposer assembly openings of the platform, the interposer assemblies are configured to be electrically connected to the electronic package, each interposer assembly including an array of interposer contacts, the interposer contacts being compressible, each interposer contact having an upper mating interface and a lower mating interface, the lower mating interfaces of the interposer contacts are configured to be mated with package contacts of the electronic package, the interposer assemblies defining separable interfaces with the electronic package; and
  cable modules captured between the carrier base block and the carrier lid, the cable modules being coupled to the upper separable interface of the interposer assemblies, each cable module including a cable module substrate having module contacts and cables terminated to the cable module substrate being electrically connected to the module contacts;
  wherein the carrier assembly is removable from the electronic package to separate the interposer assembly from the electronic package.

15. The carrier assembly of claim 14, wherein the interposer assemblies and the cable modules are sandwiched between the carrier base block and the carrier lid.

16. The carrier assembly of claim 14, wherein the carrier base block includes interposer assembly openings holding the interposer assemblies at fixed locations for mating with the electronic package, and the carrier base includes locating features for positioning the cable modules at fixed locations for mating with the interposer assemblies.

17. The carrier assembly of claim 14, further comprising thermal bridges captured between the carrier base block and the carrier lid, the thermal bridges being thermally coupled to the cable modules, the carrier base block and the carrier lid holding the thermal bridges in thermal communication with the cable modules, the thermal bridges passing through the carrier lid openings to thermally interface with the cable modules and a heat transfer device.

18. The carrier assembly of claim 14, further comprising compression hardware coupled to the carrier base block and the carrier lid, the compression hardware configured to compress the interposer contacts against the electronic package.

19. A communication system comprising:
  a host circuit board having an upper surface, the host circuit board including board contacts;
  a socket connector mounted to the upper surface, the socket connector including socket contacts electrically connected to the board contacts; and
  an electronic assembly coupled to the socket connector, the electronic assembly comprising:
  an electronic package including a package substrate having an upper surface and a lower surface, the electronic package including an integrated circuit component mounted to the upper surface of the package substrate, the electronic package includes lower package contacts electrically connected to the integrated circuit component, the lower package contacts being electrically connected to the socket contacts of the socket connector, the electronic package includes upper package contacts electrically connected to the integrated circuit component;
  interposer assemblies electrically connected to the electronic package, each interposer assembly including an array of interposer contacts, the interposer contacts being compressible, each interposer contact having an upper mating interface and a lower mating interface, the lower mating interfaces of the interposer contacts are mated with the upper package contacts, the interposer assemblies defining separable interfaces with the electronic package;
  cable modules coupled to the upper separable interface of the interposer assemblies, each cable module including a cable module substrate having module contacts and cables terminated to the cable module substrate being electrically connected to the module contacts; and
  carrier assemblies configured to be coupled to the upper surface of the electronic package, each carrier assembly including a carrier base block and a carrier lid, each carrier assembly configured to hold at least one interposer assembly and at least one cable module between the carrier base block and the carrier lid, the carrier assemblies holding the cable modules with the module contacts in electrical connection with the upper mating interfaces of the interposer contacts, the carrier assemblies holding the lower mating interfaces of the interposer contacts in electrical connection with the upper package contacts of the electronic package, the carrier assemblies being separately removable from the electronic package from each other to separate the interposer assemblies from the electronic package.

20. The communication system of claim 19, further comprising a bolster plate positioned between the upper surface of the host circuit board and the package substrate, the bolster plate including a socket connector opening receiving the socket connector, the carrier assemblies coupled to the bolster plate.

* * * * *